US011107869B2

United States Patent
Lee et al.

(10) Patent No.: US 11,107,869 B2
(45) Date of Patent: Aug. 31, 2021

(54) DISPLAY DEVICE

(71) Applicant: SAMSUNG DISPLAY CO., LTD., Yongin-si (KR)

(72) Inventors: Wonse Lee, Yongin-si (KR); Wonkyu Kwak, Yongin-si (KR); Seungwoo Sung, Yongin-si (KR); Yunkyeong In, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 152 days.

(21) Appl. No.: 16/220,731

(22) Filed: Dec. 14, 2018

(65) Prior Publication Data

US 2020/0006452 A1  Jan. 2, 2020

(30) Foreign Application Priority Data

Jul. 2, 2018  (KR) .................. 10-2018-0076703

(51) Int. Cl.
*H01L 27/32* (2006.01)
*H01L 51/50* (2006.01)
*H01L 51/00* (2006.01)

(52) U.S. Cl.
CPC ...... *H01L 27/3262* (2013.01); *H01L 27/3265* (2013.01); *H01L 27/3276* (2013.01); *H01L 51/0031* (2013.01); *H01L 51/50* (2013.01)

(58) Field of Classification Search
CPC .... G09G 3/006; G09G 3/3208; G09G 3/3225; G09G 2330/12; H01L 27/3244;

(Continued)

(56) References Cited

U.S. PATENT DOCUMENTS 6,836,140 B2 * 12/2004 Fujikawa .............. G02F 1/1309
                                                        324/754.07
7,625,259 B2 * 12/2009 Kim .................... H01L 27/3246
                                                        445/23

(Continued)

FOREIGN PATENT DOCUMENTS

EP         2043084       1/2009
JP     2010-256517      11/2010

(Continued)

OTHER PUBLICATIONS

European Search Report dated Nov. 4, 2019 Corresponding to European Patent Application No. 19171441.9.

*Primary Examiner* — Sophia T Nguyen
(74) *Attorney, Agent, or Firm* — F. Chau & Associates, LLC

(57) ABSTRACT

A display device includes a substrate including a display area and a peripheral area, an inspection terminal in the peripheral area and configured to transmit an inspection signal to the display area, an inspection wiring that connects the display area to the inspection terminal, a semiconductor resistor connected to each of the inspection terminal and the inspection wiring, an insulating film, and a planarization layer including a terminal opening. The planarization layer covers at least one end of the inspection terminal and the inspection terminal exposes a portion of the inspection terminal. The semiconductor resistor is below the inspection terminal, with an insulating film therebetween, and is in contact with the inspection terminal through a first contact hole defined in the insulating film. A portion of the semiconductor resistor is overlapped by the terminal opening.

22 Claims, 12 Drawing Sheets

(58) Field of Classification Search
CPC ... H01L 27/3276–3279; H01L 27/0288; H01L 51/0031; H01L 22/32
See application file for complete search history.

(56) References Cited

U.S. PATENT DOCUMENTS

| | | | |
|---|---|---|---|
| 7,723,134 B2* | 5/2010 | Jo | H01L 51/5218 438/30 |
| 7,750,662 B2 | 7/2010 | Yoshii | |
| 8,749,262 B2* | 6/2014 | Jung | G09G 3/006 324/760.01 |
| 8,901,577 B2* | 12/2014 | Kim | H01L 27/124 257/88 |
| 9,006,724 B2* | 4/2015 | Jung | H01L 51/0031 257/40 |
| 9,299,281 B2* | 3/2016 | In | G02F 1/13458 |
| 9,401,354 B1* | 7/2016 | Bae | H01L 27/0288 |
| 2002/0180026 A1* | 12/2002 | Liu | H01L 22/34 257/692 |
| 2003/0089991 A1* | 5/2003 | Yamazaki | H01L 29/16 257/759 |
| 2004/0137142 A1* | 7/2004 | Nishikawa | H01L 27/3288 427/66 |
| 2004/0184131 A1* | 9/2004 | Kurashina | G02F 1/136259 359/245 |
| 2005/0070039 A1* | 3/2005 | Yamazaki | G09G 3/006 438/33 |
| 2005/0168456 A1* | 8/2005 | Nakayama | G09G 3/006 345/204 |
| 2005/0258769 A1* | 11/2005 | Imamura | H05B 47/20 315/161 |
| 2007/0120790 A1* | 5/2007 | Jeon | G09G 3/006 345/87 |
| 2007/0145370 A1 | 6/2007 | Moriwaki | |
| 2008/0012469 A1* | 1/2008 | Park | H01L 27/3248 313/500 |
| 2008/0074137 A1* | 3/2008 | Kim | G02F 1/13458 324/750.3 |
| 2008/0230767 A1* | 9/2008 | Jung | H01L 27/1248 257/40 |
| 2008/0277705 A1* | 11/2008 | Takahashi | H01L 27/0629 257/295 |
| 2009/0079464 A1* | 3/2009 | Yoshii | G02F 1/136204 324/760.01 |
| 2009/0102364 A1* | 4/2009 | Suh | H01L 27/3276 313/504 |
| 2009/0310051 A1* | 12/2009 | Kim | G02F 1/136204 349/40 |
| 2009/0311824 A1* | 12/2009 | Shin | H01L 51/56 438/80 |
| 2010/0149473 A1* | 6/2010 | Guo | G02F 1/1345 349/122 |
| 2010/0181567 A1* | 7/2010 | Mun | H01L 24/05 257/48 |
| 2010/0271582 A1 | 10/2010 | Yamakawa et al. | |
| 2010/0295759 A1* | 11/2010 | Tanaka | H01L 51/5259 345/76 |
| 2011/0050660 A1* | 3/2011 | Kim | G09G 3/006 345/205 |
| 2011/0127519 A1* | 6/2011 | Kang | H01L 27/3244 257/43 |
| 2011/0198572 A1* | 8/2011 | Park | H01L 27/3258 257/40 |
| 2012/0146032 A1* | 6/2012 | Lee | H01L 21/00 257/59 |
| 2012/0206160 A1* | 8/2012 | Wu | G01R 31/2601 324/756.07 |
| 2012/0256186 A1 | 10/2012 | Park et al. | |
| 2013/0049029 A1* | 2/2013 | Kim | H01L 27/124 257/88 |
| 2013/0335397 A1* | 12/2013 | Kim | G09G 3/006 345/212 |
| 2014/0042397 A1* | 2/2014 | Cho | H01L 27/1288 257/40 |
| 2014/0062520 A1* | 3/2014 | Kim | G09G 3/006 324/762.01 |
| 2014/0103317 A1* | 4/2014 | Choi | H01L 27/1225 257/40 |
| 2014/0139509 A1* | 5/2014 | Kim | G09G 3/006 345/212 |
| 2014/0319471 A1* | 10/2014 | Kim | H01L 51/0031 257/40 |
| 2014/0346475 A1* | 11/2014 | Cho | H01L 27/326 257/40 |
| 2014/0368228 A1* | 12/2014 | Kim | H01L 51/0097 324/750.3 |
| 2014/0374703 A1* | 12/2014 | Jung | H01L 51/0031 257/40 |
| 2015/0008432 A1* | 1/2015 | Kim | H01L 22/32 257/48 |
| 2015/0048352 A1* | 2/2015 | Ichiki | H01L 27/14603 257/40 |
| 2015/0144915 A1* | 5/2015 | Lee | H01L 22/32 257/40 |
| 2015/0235913 A1* | 8/2015 | In | G09G 3/006 257/48 |
| 2015/0262536 A1* | 9/2015 | Chen | G02F 1/13458 345/92 |
| 2015/0279258 A1* | 10/2015 | Shin | G09G 3/006 324/755.01 |
| 2016/0011108 A1* | 1/2016 | Jeon | G09G 3/3648 356/445 |
| 2016/0043010 A1* | 2/2016 | Kwak | H01L 27/3276 257/48 |
| 2016/0087023 A1* | 3/2016 | Maeda | H01L 27/3276 257/40 |
| 2016/0178666 A1* | 6/2016 | Oh | G01R 31/2889 324/750.24 |
| 2016/0209460 A1* | 7/2016 | Lee | G09G 3/006 |
| 2016/0351093 A1* | 12/2016 | Kim | G09G 3/2092 |
| 2016/0379906 A1* | 12/2016 | Kim | G09G 3/3688 257/48 |
| 2016/0379907 A1* | 12/2016 | Ko | H01L 27/1237 257/48 |
| 2016/0380038 A1* | 12/2016 | Kang | H01L 27/3246 257/40 |
| 2017/0125505 A1* | 5/2017 | Oh | H01L 51/52 |
| 2017/0141181 A1* | 5/2017 | Ni | G09G 3/006 |
| 2017/0155088 A1* | 6/2017 | Kim | H01L 27/3276 |
| 2017/0186831 A1* | 6/2017 | Nam | H01L 27/3248 |
| 2017/0186957 A1 | 6/2017 | Lee et al. | |
| 2017/0278918 A1* | 9/2017 | Jeon | H01L 27/3276 |
| 2017/0279071 A1* | 9/2017 | Tamekawa | H01L 27/3244 |
| 2018/0033355 A1* | 2/2018 | Lee | H01L 27/3223 |
| 2018/0053905 A1* | 2/2018 | Lee | H01L 27/3276 |
| 2018/0082643 A1* | 3/2018 | Jeong | G09G 3/342 |
| 2018/0108724 A1* | 4/2018 | Lee | H01L 27/0277 |
| 2018/0138205 A1* | 5/2018 | Miyamoto | H01L 27/14603 |
| 2018/0143720 A1* | 5/2018 | Kim | G06F 3/0446 |
| 2018/0145125 A1* | 5/2018 | Lee | H01L 27/3262 |
| 2018/0158741 A1* | 6/2018 | Kim | H01L 22/12 |
| 2018/0197484 A1* | 7/2018 | Moon | G09G 3/3225 |
| 2018/0226467 A1* | 8/2018 | Ka | H01L 27/3244 |
| 2018/0240736 A1* | 8/2018 | Liu | H01L 23/5256 |
| 2018/0286939 A1* | 10/2018 | Lee | G09G 3/006 |
| 2018/0331160 A1* | 11/2018 | Beak | G06F 3/0446 |
| 2018/0350701 A1* | 12/2018 | Kim | H01L 27/1218 |
| 2018/0366494 A1* | 12/2018 | Lee | H01L 27/124 |
| 2019/0097162 A1* | 3/2019 | Wang | H01L 27/3246 |
| 2019/0131572 A1* | 5/2019 | Gwon | G06F 3/044 |
| 2019/0172888 A1* | 6/2019 | Choi | H01L 51/5234 |
| 2019/0236993 A1* | 8/2019 | Wang | H01L 27/32 |
| 2019/0392767 A1* | 12/2019 | Kim | G09G 3/3225 |
| 2020/0006452 A1* | 1/2020 | Lee | H01L 27/0288 |

(56) References Cited

U.S. PATENT DOCUMENTS

| | | | |
|---|---|---|---|
| 2020/0091467 A1* | 3/2020 | Sakamoto | H01L 51/5271 |
| 2020/0273928 A1* | 8/2020 | Che | G09G 3/3258 |

FOREIGN PATENT DOCUMENTS

| | | |
|---|---|---|
| KR | 10-2009-0040658 | 4/2009 |
| KR | 10-2012-0113543 | 10/2012 |
| KR | 10-2015-0098698 | 8/2015 |

* cited by examiner

FIG. 5B

| | 1 | 2 | 3 | 4 | 5 | 6 | 7 | 8 | 9 |
|---|---|---|---|---|---|---|---|---|---|
| RESISTANCE(Ω) | 1k | 1k | 1k | 4k | 4k | 4k | 8k | 8k | 8k |
| WIDTH(μm) | 120 | 60 | 30 | 120 | 60 | 30 | 120 | 60 | 30 |
| THRESHOLD VOLTAGE(V) | 0.4k | 0.2k | 0.2k | 1.1k | 0.5k | 0.3k | 1.9k | 0.9k | 0.5k |

DISPLAY DEVICE

CROSS-REFERENCE TO RELATED APPLICATIONS

This application claims priority under 35 U.S.C. § 119 to Korean Patent Application No. 10-2018-0076703, filed on Jul. 2, 2018 in the Korean Intellectual Property Office, the disclosure of which is incorporated by reference herein in its entirety.

TECHNICAL FIELD

Exemplary embodiments relate to a display device, and more particularly, to a display device having an inspection terminal.

DISCUSSION OF THE RELATED ART

A display device typically includes a substrate divided into a display area and a peripheral area disposed outside the display area. The display area includes scan lines and data lines that are insulated from each other. A plurality of pixels connected to the scan lines and the data lines is disposed in the display area. Each pixel includes a thin-film transistor and a pixel electrode electrically connected to the thin-film transistor, and the display area includes an opposite electrode commonly provided to the pixels. The peripheral area may include various wirings for transmitting an electrical signal to the display area, as well as a scan driver, a data driver, and a controller.

SUMMARY

Exemplary embodiments include a display device having an inspection terminal for inspecting defects during manufacture. However, the scope of the disclosure is not limited thereto.

In an exemplary embodiment, a display device includes a substrate including a display area and a peripheral area. The display area includes a plurality of pixels that display an image. The peripheral area is disposed outside the display area. The display device further includes an inspection terminal disposed in the peripheral area and configured to transmit an inspection signal to the display area, an inspection wiring that connects the display area to the inspection terminal, a semiconductor resistor connected to each of the inspection terminal and the inspection wiring, an insulating film, and a planarization layer including a terminal opening. The planarization layer covers at least one end of the inspection terminal and the terminal opening exposes a portion of the inspection terminal. The semiconductor resistor is disposed below the inspection terminal, the insulating film is disposed between the semiconductor resistor and the inspection terminal, and the semiconductor resistor is in contact with the inspection terminal through a first contact hole defined in the insulating film. A portion of the semiconductor resistor is overlapped by the terminal opening.

In an exemplary embodiment, a display device includes a substrate including a display area and a peripheral area disposed outside the display area, and a pixel including a thin-film transistor and a display element. The thin-film transistor is disposed in the display area and includes a semiconductor layer, a gate electrode, a source electrode, and a drain electrode, and the display element is connected to the thin-film transistor. The display device further includes a driving terminal unit disposed in the peripheral area and including a controller configured to control transmission of a driving signal to the pixel, an inspection terminal disposed in the peripheral area and configured to transmit an inspection signal to the pixel, an insulating film, and a semiconductor resistor disposed below the inspection terminal. The insulating film is disposed between the semiconductor resistor and the inspection terminal, and the semiconductor resistor is in contact with the inspection terminal through a first contact hole defined in the insulating film. The display device further includes a planarization layer including a terminal opening. The planarization layer covers at least one end of the inspection terminal and the terminal opening exposes a portion of the inspection terminal. A portion of the semiconductor resistor is overlapped by the terminal opening.

In an exemplary embodiment, a display device includes a substrate including a display area and a peripheral area, in which the display area includes a plurality of pixels that display an image and the peripheral area is disposed outside the display area. The display device further includes an inspection terminal disposed in the peripheral area and configured to transmit an inspection signal to the display area, an inspection wiring that connects the display area to the inspection terminal, a semiconductor resistor connected to each of the inspection terminal and the inspection wiring, and a planarization layer including a terminal opening. The semiconductor resistor is disposed below the inspection terminal and contacts the inspection terminal through a contact hole, and the contact hole and a portion of the semiconductor resistor are disposed within a boundary of the terminal opening.

BRIEF DESCRIPTION OF THE DRAWINGS

The above and other aspects of the present disclosure will become more apparent by describing in detail exemplary embodiments thereof with reference to the accompanying drawings, in which:

FIGS. 5A and 5B illustrate a relationship between resistance, a width, and a threshold voltage of a semiconductor resistor according to an exemplary embodiment.

DETAILED DESCRIPTION

Figure 1:
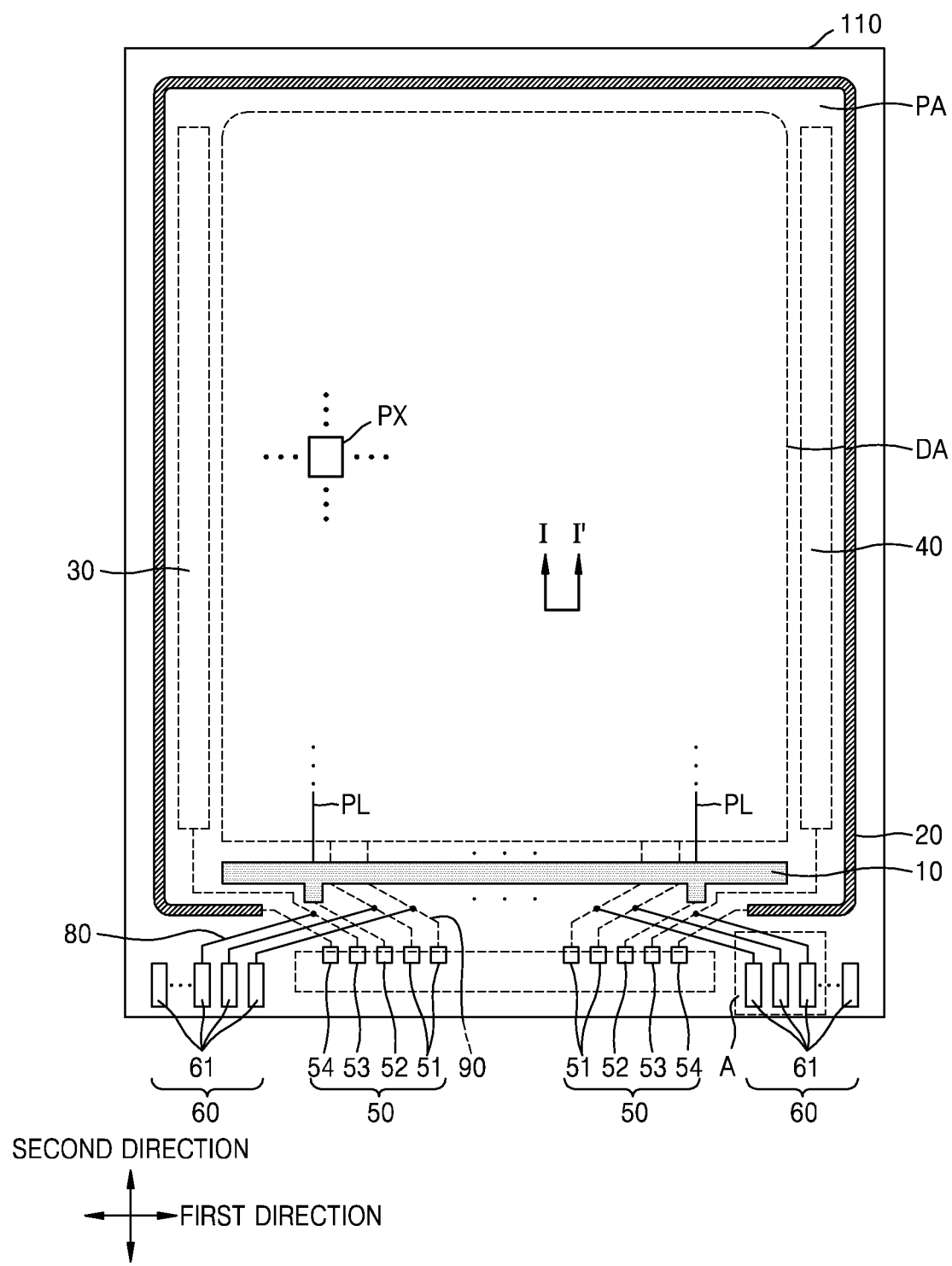
FIG. 1 is a plan view of a display device according to an exemplary embodiment.

Exemplary embodiments of the present disclosure will be described more fully hereinafter with reference to the accompanying drawings. Like reference numerals may refer to like elements throughout the accompanying drawings.

It will be understood that the terms "first", "second", etc. are used herein to distinguish one element from another, and the elements are not limited by these terms. Thus, a "first" element in an exemplary embodiment may be described as a "second" element in another exemplary embodiment.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. For example, when a layer, region, or component is electrically connected to another portion, the layer, region, or component may be directly electrically connected to the portion or may be indirectly connected to the portion through another layer, region, or component. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Display devices may be used to display images, text, etc., and can be classified into liquid crystal displays, electrophoretic displays, organic light-emitting displays, inorganic light-emitting displays, field emission displays, surface-conduction electron-emitter displays, plasma displays, and cathode ray displays.

Hereinafter, an organic light-emitting display will be described as a display apparatus according to an exemplary embodiment. However, it is to be understood that a display device according to an exemplary embodiment is not limited thereto and various kinds of display devices may be used.

FIG. 1 is a plan view of a display device according to an exemplary embodiment.

Referring to FIG. 1, a substrate 110 of the display device is divided into a display area DA and a peripheral area PA around the display area DA. The display area DA includes a plurality of pixels PX, which display an image. The plurality of pixels PX may be connected to a plurality of scan lines, a plurality of data lines crossing the scan lines, and a plurality of driving voltage lines PL.

Each pixel PX emits light of, for example, red, green, blue, or white, and may include, for example, an organic light-emitting device. Each pixel PX may further include elements such as a thin-film transistor (TFT), a storage capacitor, etc. The display area DA provides a predetermined image through light emitted from the pixels PX. As used herein, the term pixel PX refers to a sub-pixel which emits light of any one of red, green, blue or white as described above.

The peripheral area PA is an area in which the pixels PX are not disposed, and does not provide an image. The peripheral area PA may include a first power supply voltage line 10 and a second power supply voltage line 20 to which different power supply voltages are applied. A first scan driver 30, a second scan driver 40, a driving terminal unit 50, and an inspection terminal unit 60 may be disposed in the peripheral area PA.

The first power supply voltage line 10 may be disposed such that it corresponds to a lower end of the display area DA in the peripheral area PA. For example, as shown in FIG. 1, in an exemplary embodiment, the first power supply voltage line 10 may be disposed in the peripheral area PA below a lower end of the display area DA. The plurality of driving voltage lines PL transmits a driving voltage to the plurality of pixels PX, is disposed in the display area DA, and may be connected to the first power supply voltage line 10. The first power supply voltage line 10 may be connected to a first terminal 52 of the driving terminal unit 50.

The second power supply voltage line 20 may be disposed such that it partially surrounds the display area DA in the peripheral area PA. In exemplary embodiments, the second power supply voltage line 20 may fully extend along all sides of the display area DA except for one side adjacent to the first power supply voltage line 10 (e.g., the bottom side in FIG. 1). However, the disclosure is not limited thereto. The second power supply voltage line 20 may be disposed such that it corresponds to either one side or two sides of the display area DA, and various modifications may be made. The second power supply voltage line 20 may be connected to a second terminal 53 of the driving terminal unit 50.

The first scan driver 30 and the second scan driver 40 may be disposed in the peripheral area PA with the display area DA disposed therebetween. For example, the first scan driver 30 may be disposed on a left side of the display area DA, and the second scan driver 40 may be disposed on a right side of the display area DA. However, the present disclosure is not limited thereto. A scan signal generated by the first scan driver 30 may be supplied to some pixels PX through a first scan line, and a scan signal generated by the second scan driver 40 may be supplied to some pixels PX through a second scan line.

In exemplary embodiments, the first scan driver 30 and the second scan driver 40 are disposed on both sides of the display area DA and may perform dual scanning. For example, the first scan driver 30 may generate a scan signal and transmit the scan signal to some of the pixels PX included in the display area DA, and the second scan driver 40 may generate a scan signal and transmit the scan signal to the remaining pixels PX included in the display area DA. The first scan driver 30 and the second scan driver 40 may be synchronized by a synchronized clock signal.

Although FIG. 1 shows that the scan drivers 30 and 40 are disposed on both sides of the display area DA, the disclosure is not limited thereto. For example, the scan drivers 30 and 40 may be disposed on only one side of the display area DA or may be disposed on a printed circuit board instead of in the peripheral area PA, and various modifications may be made.

The driving terminal unit 50 is disposed in the peripheral area PA and includes a plurality of terminals 51, 52, 53, and 54. The driving terminal unit 50 may be exposed without being covered by an insulating layer, and may be electrically connected to a controller such as a flexible printed circuit board or a driver IC chip. The controller changes a plurality of image signals transmitted from the outside into a plurality of image data signals, and transmits the changed image signals to the display area DA through a terminal 51. Furthermore, the controller may receive a vertical synchronization signal, a horizontal synchronization signal, and a clock signal, may use these signals to generate control signals for controlling driving of the first and second scan drivers 30 and 40, and may transmit the control signals to each of the first and second scan drivers 30 and 40 through a terminal 54. The controller may transmit different voltages to the first power supply voltage line 10 and the second power supply voltage line 20 through the first and second terminals 52 and 53, respectively. The driving terminal unit 50 may be connected to a driving wiring 90 to transmit voltages and various signals to the display area DA.

The first power supply voltage line 10 may provide a first power supply voltage ELVDD to each pixel PX, and the second power supply voltage line 20 may provide a second power supply voltage ELVSS to each pixel PX. For example, the first power supply voltage ELVDD may be provided to each pixel PX through the driving voltage line PL connected to the first power supply voltage line 10. The second power supply voltage ELVSS may be connected to a cathode of the organic light-emitting device provided in each pixel PX in the peripheral area PA.

The inspection terminal unit 60 includes a plurality of inspection terminals 61 and may be disposed on one side or both sides of the driving terminal unit 50 in the peripheral area PA. The inspection terminal unit 60 transmits various inspection signals for inspecting each pixel PX of the display area DA to each pixel PX before a controller such as a flexible printed circuit board or a driver IC chip is mounted on the substrate 110. Although FIG. 1 shows that inspection terminal units 60 are disposed on both sides of the driving terminal unit 50, the disclosure is not limited thereto. For example, the positions, sizes, and arrangement relationship of the inspection terminal unit 60 and the driving terminal unit 50 are not limited to those shown in FIG. 1, and may be variously modified.

Each inspection terminal 61 of the inspection terminal unit 60 may be connected to an inspection wiring 80. The inspection wiring 80 is connected to the driving wiring 90 and may transmit an inspection signal to the display area DA. For example, the inspection wiring 80 may be branched from the driving wiring 90. The driving wiring 90 may transmit inspection signals supplied from the inspection terminal unit 60 to the display area DA before transmitting signals supplied from the driving terminal unit 50. However, the disclosure is not limited thereto. The inspection wiring 80 may be directly connected to the display area DA separately from the driving wiring 90, and various modifications may be made.

Each of the inspection terminals 61 of the inspection terminal unit 60 may include an electrostatic discharge protection device for preventing damage due to electrostatic discharge (ESD). ESD refers to a phenomenon in which, when separated objects are in contact with each other, a large current instantaneously flows due to a large voltage difference between the objects. To prevent such ESD, an inspection pad unit may include a semiconductor resistor including a semiconductor material, for example, polysilicon or an oxide semiconductor, as a discharge protection device. A more detailed description of the inspection terminals 61 according to exemplary embodiments will be described below.

Figure 2A:
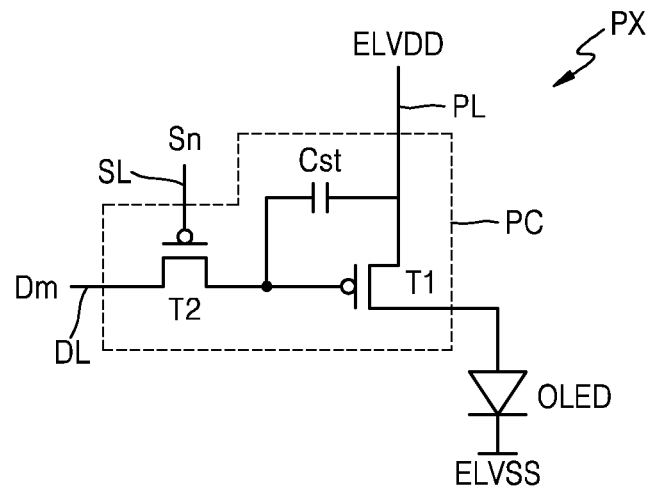
FIGS. 2A and 2B are equivalent circuit diagrams of a pixel in a display device according to an exemplary embodiment.
Figure 2B:
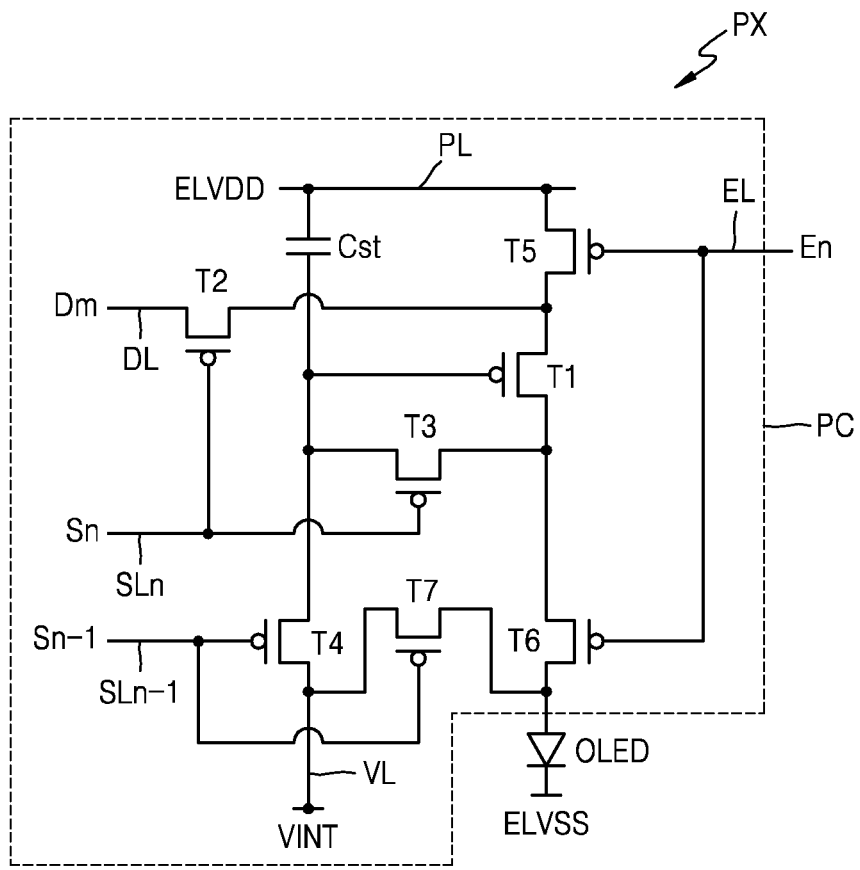

FIGS. 2A and 2B are equivalent circuit diagrams of a pixel in a display device according to an exemplary embodiment. For example, the pixel illustrated in FIGS. 2A and 2 may be any of the pixels PX in the display device.

Referring to FIG. 2A, each pixel PX includes a pixel circuit PC connected to the scan line SL and the data line DL and an organic light-emitting device OLED connected to the pixel circuit PC. The OLED may also be referred to herein as a display element.

The pixel circuit PC includes a driving thin-film transistor (TFT) T1, a switching TFT T2, and a storage capacitor Cst. The switching TFT T2 is connected to the scan line SL and the data line DL, and supplies a data signal Dm input through the data line DL according to a scan signal Sn to the driving TFT T1.

The storage capacitor Cst is connected to the switching TFT T2 and the driving voltage line PL, and stores a voltage corresponding to a difference between a voltage supplied from the switching TFT T2 and the first power supply voltage ELVDD (or driving voltage) supplied to the driving voltage line PL.

The driving TFT T1 is connected to the driving voltage line PL and the storage capacitor Cst, and may control a driving current flowing to the organic light-emitting device OLED from the driving voltage line PL corresponding to a voltage value stored in the storage capacitor Cst. The organic light-emitting device OLED may emit light having predetermined luminance by the driving current.

Although FIG. 2A illustrates a case in which the pixel circuit PC includes two TFTs and one storage capacitor Cst, the disclosure is not limited thereto.

Referring to FIG. 2B, the pixel circuit PC may include the driving and switching TFTs T1 and T2, a compensation TFT T3, a first initialization TFT T4, a first emission control TFT T5, a second emission control TFT T6, and a second initialization TFT T7.

Although FIG. 2B shows a case in which signal lines SLn, SLn-1, EL, and DL, an initialization voltage line VL, and the driving voltage line PL are provided for each pixel PX, the disclosure is not limited thereto. For example, in an exemplary embodiment, at least one of the signal lines SLn, SLn-1, EL, and DL, and/or the initialization voltage line VL may be shared by neighboring pixels.

A drain electrode of the driving TFT T1 may be electrically connected to the organic light-emitting device OLED via the second emission control TFT T6. The driving TFT T1 receives the data signal Dm according to a switching operation of the switching TFT T2 and supplies a driving current to the organic light-emitting device OLED.

A gate electrode of the switching TFT T2 is connected to the scan line SL and a source electrode thereof is connected to the data line DL. A drain electrode of the switching TFT T2 may be connected to a source electrode of the driving TFT T1 and may further be connected to the driving voltage line PL via the first emission control TFT T5.

The switching TFT T2 is turned on in response to the scan signal Sn received through the scan line SL, and performs a switching operation for transmitting the data signal Dm transmitted to the data line DL to a source electrode of the driving TFT T1.

A gate electrode of the compensation TFT T3 may be connected to a scan line SLn. A source electrode of the compensation TFT T3 may be connected to the drain electrode of the driving TFT T1 and may further be connected to a pixel electrode of the organic light-emitting device OLED via the second emission control TFT T6. A drain electrode of the compensation TFT T3 may be connected to any one electrode of the storage capacitor Cst, a source electrode of the first initialization TFT T4, and a gate electrode of the driving TFT T1. The compensation TFT T3 is turned on in response to the scan signal Sn received through the scan line SL to connect the gate electrode and the drain electrode of the driving TFT T1 to each other, thereby diode-connecting the driving TFT T1.

A gate electrode of the first initialization TFT T4 may be connected to a previous scan line SLn-1. The drain electrode of the first initialization TFT T4 may be connected to the initialization voltage line VL. The source electrode of the first initialization TFT T4 may be connected together to any one electrode of the storage capacitor Cst, the drain electrode of the compensation TFT T3, and the gate electrode of the driving TFT T1. The first initialization TFT T4 may be turned on in response to a previous scan signal Sn-1 received through the previous scan line SLn-1 to transmit an initialization voltage VINT to the gate electrode of the driving TFT T1 to perform an initialization operation for initializing the voltage of the gate electrode of the driving TFT T1.

A gate electrode of the first emission control TFT T5 may be connected to an emission control line EL. A source electrode of the first emission control TFT T5 may be connected to the driving voltage line PL. A drain electrode of the first emission control TFT T5 may be connected to the source electrode of the driving TFT T1 and the drain electrode of the switching TFT T2.

A gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the organic light-emitting device OLED. The first emission control TFT T5 and the second emission control TFT T6 are simultaneously turned on in response to the emission control signal En received through the emission control line EL so that the first power supply voltage ELVDD is transmitted to the organic light-emitting device OLED, and a driving current flows through the organic light-emitting device OLED.

A gate electrode of the second initialization TFT T7 may be connected to the previous scan line SLn-1. A source electrode of the second initialization TFT T7 may be connected to the pixel electrode of the organic light-emitting device OLED. A drain electrode of the second initialization TFT T7 may be connected to the initialization voltage line VL. The second initialization TFT T7 may be turned on in response to the previous scan signal Sn-1 received through the previous scan line SLn-1 to initialize the pixel electrode of the organic light-emitting device OLED.

Although FIG. 2B illustrates a case in which the first initialization TFT T4 and the second initialization TFT T7 are connected to the previous scan line SLn-1, the disclosure is not limited thereto. For example, in an exemplary embodiment, the first initialization TFT T4 may be connected to the previous scan line SLn-1 and driven according to the previous scan signal Sn-1. The second initialization TFT T7 may be connected to a separate signal line (e.g., a next scan line) and driven according to a signal transmitted to the corresponding scan line.

The other electrode of the storage capacitor Cst may be connected to the driving voltage line PL. Any one electrode of the storage capacitor Cst may be connected together to the gate electrode of the driving TFT T1, the drain electrode of the compensation TFT T3, and the source electrode of the first initialization TFT T4.

An opposite electrode (e.g., a cathode) of the organic light-emitting device OLED is supplied with the second power supply voltage ELVSS (or a common power supply voltage). The organic light-emitting device OLED receives a driving current from the driving TFT T1 and emits light.

The pixel circuit PC is not limited to the circuit design and the number of TFTs and storage capacitors described with reference to FIGS. 2A and 2B, and the number and the circuit design may vary according to exemplary embodiments.

A display device according to an exemplary embodiment will be described below in detail with reference to FIGS. 3 to 7.

Figure 3:
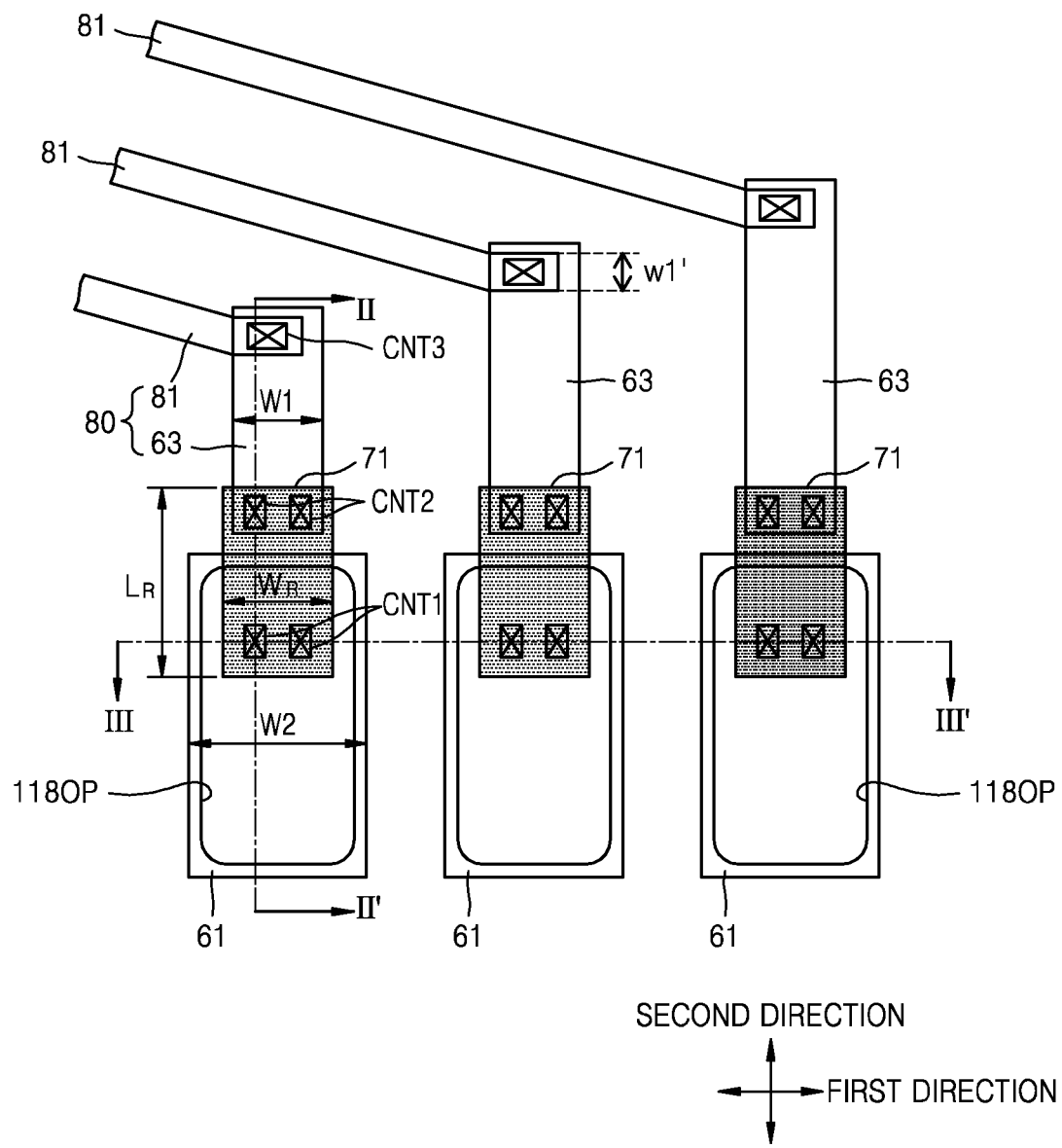
FIG. 3 is an enlarged view of portion A of FIG. 1 according to an exemplary embodiment.
Figure 4:
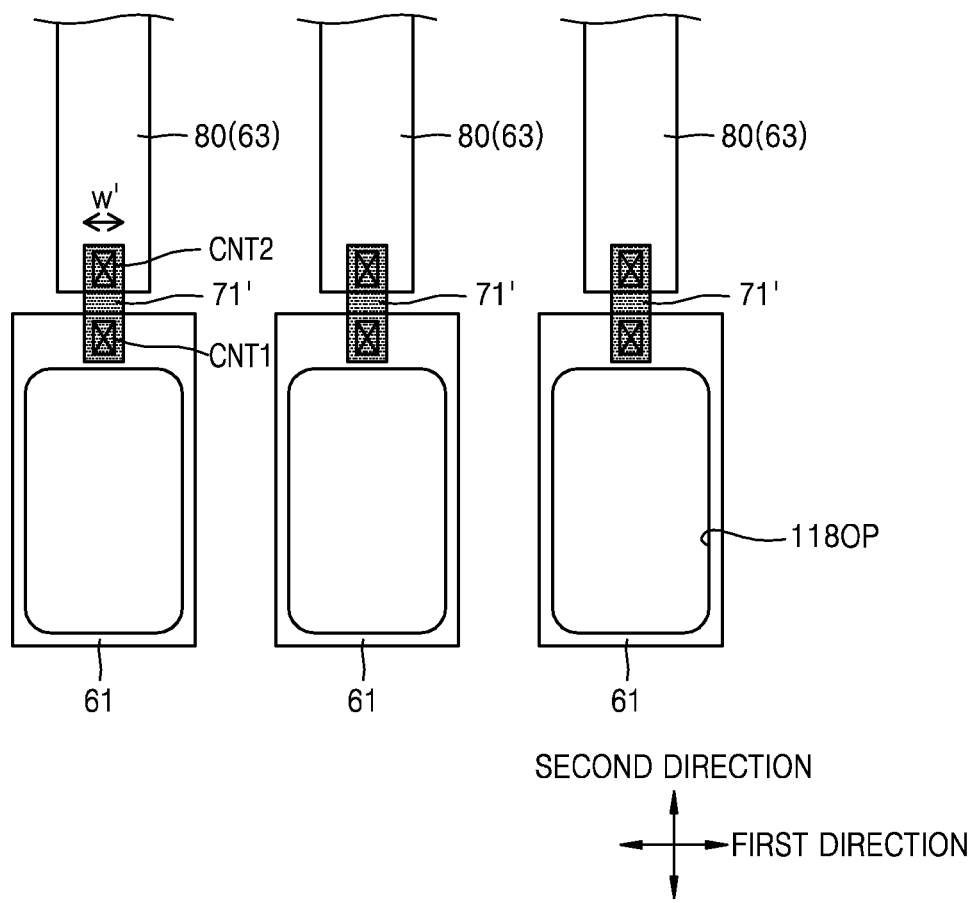
FIG. 4 is a view of an inspection terminal unit according to a comparative example.
Figure 5A:
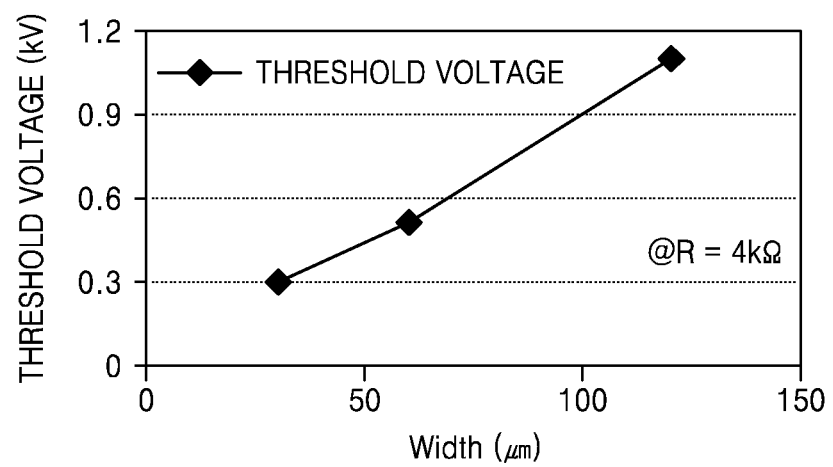
Figure 6:
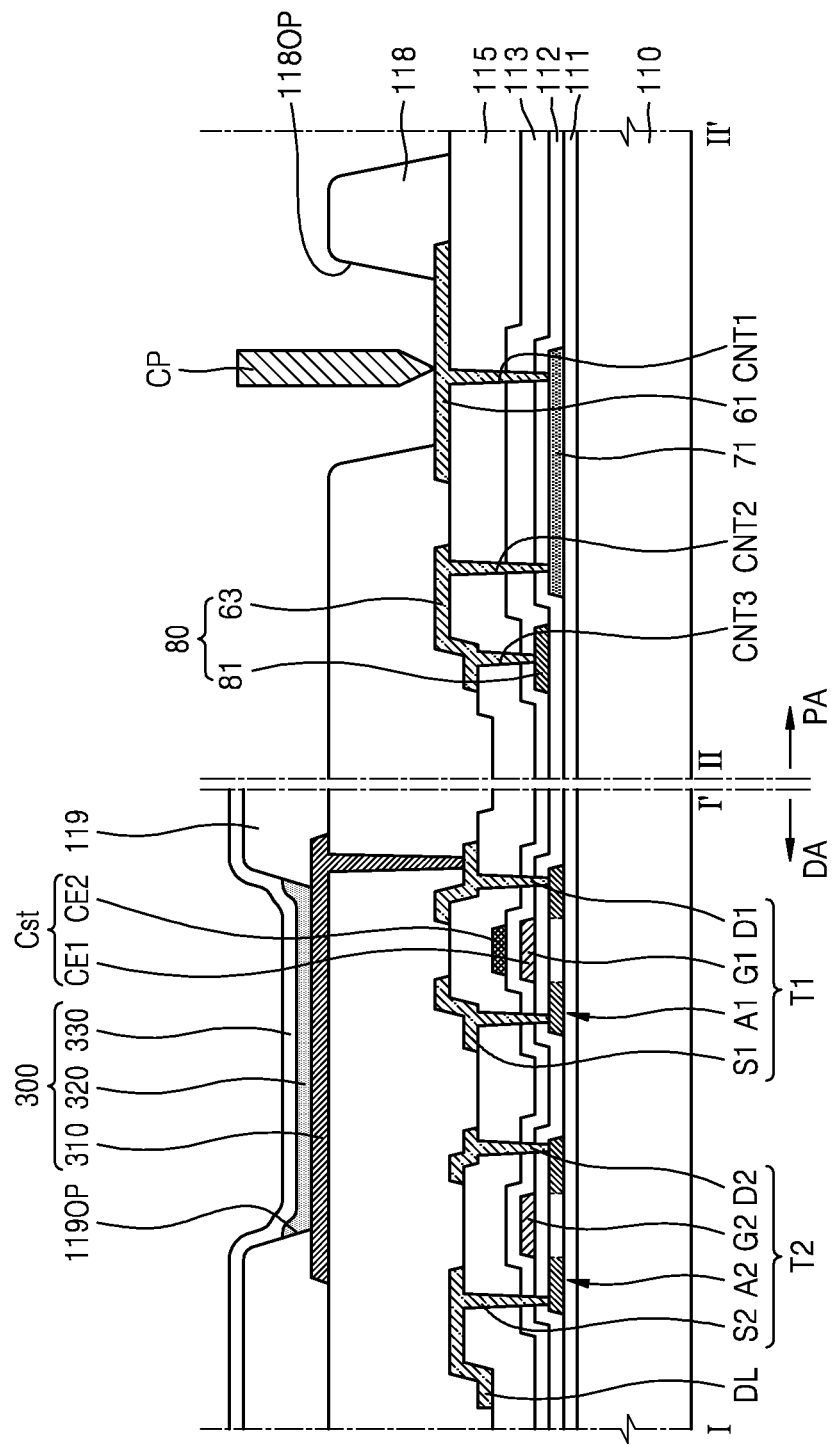
FIG. 6 is a cross-sectional view taken along line I-I' of FIG. 1 and line II-II' of FIG. 3 according to an exemplary embodiment.
Figure 7:
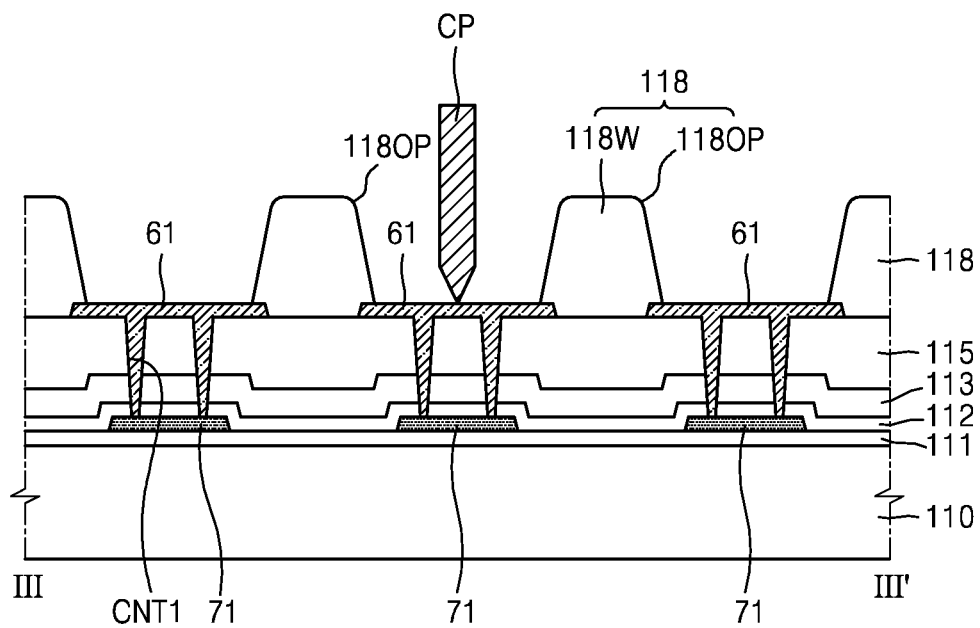
FIG. 7 is a cross-sectional view taken along line III-III' of FIG. 3 according to an exemplary embodiment.

FIG. 3 is an interlayer layout corresponding to portion A in FIG. 1, and is a view of an inspection terminal unit according to an exemplary embodiment. FIG. 4 is a view of an inspection terminal unit according to a comparative example. FIGS. 5A and 5B illustrate a relationship between resistance, a width, and a threshold voltage of a semiconductor resistor according to an exemplary embodiment. FIG. 6 is a cross-sectional view taken along line I-I' of FIG. 1 and line II-II' of FIG. 3 according to an exemplary embodiment. FIG. 7 is a cross-sectional view taken along line III-III' of FIG. 3 according to an exemplary embodiment.

Referring to FIG. 3, a display device according to an exemplary embodiment has the inspection terminal unit 60 disposed in the peripheral area PA (see FIG. 1). The inspection terminal unit 60 includes the plurality of inspection terminals 61 and is connected to the inspection wiring 80. The inspection wiring 80 is connected to the display area DA so that inspection signals from the inspection terminal 61 may be transmitted to each pixel in the display area DA.

A semiconductor resistor 71 is disposed between the inspection terminal 61 and the inspection wiring 80. The semiconductor resistor 71 may protect pixels from ESD. At least one end of the inspection terminal 61 may be covered with a planarization layer 118 (see FIG. 6), and a central portion of the inspection terminal 61 may be exposed by a terminal opening 118OP defined in the planarization layer 118 so as to be in contact with an inspection pin CP (see FIG. 6) supplying inspection signals. Herein, the term "central portion" may refer to a portion of the inspection terminal 61 other than ends of the inspection terminal 61. Thus, as shown in FIG. 6, in an exemplary embodiment, the planarization layer 118 covers at least one end of the inspection terminal 61 and the terminal opening 118OP exposes a portion (e.g., a central portion) of the inspection terminal 61 other than the covered at least one end.

The semiconductor resistor 71 according to an exemplary embodiment may be disposed to at least partially correspond to the terminal opening 118OP. For example, the semiconductor resistor 71 may be disposed to at least partially overlap the terminal opening 118OP. Accordingly, the semiconductor resistor 71 according to an exemplary embodiment has an area overlapping the inspection terminal 61, and a size of the peripheral area PA may be minimized or reduced. That is, a dead space of the peripheral area PA may be minimized or reduced according to exemplary embodiments.

The semiconductor resistor 71 may protect pixels from ESD. Thus, a predetermined resistance value is set for the semiconductor resistor 71. In exemplary embodiments, the resistance value of the semiconductor resistor 71 may be between about 3 kΩ and about 10 kΩ.

To reduce a length $L_R$ of the semiconductor resistor 71 to minimize or reduce a size of the peripheral area PA, it may be considered to reduce a width $W_R$ of the semiconductor resistor 71 in consideration of the resistance value of the semiconductor resistor 71.

However, if the width $W_R$ of the semiconductor resistor 71 is reduced only in consideration of the resistance value of the semiconductor resistor 71, the current density is increased, and the semiconductor resistor 71 may not protect pixels from ESD. That is, even if the semiconductor resistor 71 has an appropriate resistance value, defects due to ESD may still occur.

Referring to FIG. 4, which is a comparative example, semiconductor resistors 71' increase a resistance value between the inspection terminal 61 and the inspection wiring 80. Therefore, in general, the semiconductor resistors 71' are disposed so as to be connected to an end of the inspection terminal 61 and an end of the inspection wiring, respectively, and are not disposed so as to correspond to the terminal opening 118OP. Thus, a width W' of a semiconductor resistor 71' is less than the width W1 of the inspection wiring 80, and a current density passing through the semiconductor resistor 71' may become high, resulting in, for example, disconnection.

Referring again to FIG. 3, in exemplary embodiments, the semiconductor resistor 71' is disposed so as to correspond to the terminal opening 118OP where the semiconductor resistor 71 and the inspection terminal 61 are exposed. As a result, a size of the peripheral area PA may be minimized or reduced without reducing the width $W_R$ of the semiconductor resistor 71.

One end of the semiconductor resistor 71 is connected to the inspection terminal 61 through a first contact hole CNT1. Accordingly, the first contact hole CNT1 may be disposed to correspond to an inside of the terminal opening 118OP. For example, the first contact hole CNT1 may be disposed within a boundary of the terminal opening 118OP. A plurality of first contact holes CNT1 may be provided for one semiconductor resistor 71. However, the disclosure is not limited thereto. For example, in an exemplary embodiment, only one first contact hole CNT1 may be provided for one semiconductor resistor 71.

In an exemplary embodiment, the inspection wiring 80 may include a first connection wiring 63 and a second connection wiring 81. The first connection wiring 63 may be a wiring directly connected to the semiconductor resistor 71 through a second contact hole CNT2. The second connection wiring 81 may be a wiring provided on a layer different from the first connection wiring 63, and may be connected to the first connection wiring 63 through a third contact hole CNT3.

The first connection wiring 63 may have the width W1 that is less than the width $W_R$ of the semiconductor resistor. The second connection wiring 81 may have a width W1' that is less than the width $W_R$ of the semiconductor resistor. That is, the inspection wiring 80 may have the width W1' that is less than the width $W_R$ of the semiconductor resistor.

In exemplary embodiments, the width $W_R$ of the semiconductor resistor may be less than or about equal to a width W2 of the inspection terminal 61. In exemplary embodiments, the width $W_R$ of the semiconductor resistor may be about 25% to about 80% of the width W2 of the inspection terminal 61.

In exemplary embodiments, the first connection wiring 63 may be disposed on a same layer as that of the inspection terminal 61. In exemplary embodiments, the second connection wiring 81 may be a wiring on a same layer as that of the driving wiring 90 (see FIG. 1). The second connection wiring 81 may be a wiring electrically connected to the driving wiring 90.

In the present disclosure, a length of a wiring or a terminal may be a length extending in a main direction to which a current due to an inspection signal flows when the inspection signal is applied, and widths W1, W1', $W_R$, and W2 of the wiring or terminal may be a length measured in a direction substantially perpendicular to the main direction of the current due to the inspection signal when the inspection signal is applied. Further, the width may be a width in a region other than a region in which a contact hole for connecting members (wiring, terminal, semiconductor resistor, etc.) is disposed, and a width in a non-overlapping region between the members.

The plurality of inspection terminals 61 may be disposed at a predetermined interval in a first direction, and may extend in a second direction crossing the first direction (see FIG. 3). Although the center of the plurality of inspection terminals 61 is shown as being disposed in a line along the first direction, the disclosure is not limited thereto. For example, in an exemplary embodiment, the center of the inspection terminals 61 may be disposed in a zigzag manner along the first direction, and various modifications may be made.

In exemplary embodiments, the width $W_R$ and length $L_R$ of the semiconductor resistor 71 connected to each of the inspection terminals 61 may vary within a suitable range, for example, within a range of suitable resistance values or within a range of suitable widths. In exemplary embodiments, the widths W1 and W1' and lengths of inspection wirings 80 connected to the respective inspection terminals 61 may vary.

FIG. 5A shows data obtained by measuring a value of a threshold voltage according to a change of the width $W_R$ of the semiconductor resistor 71 when a resistance value of the semiconductor resistor 71 is maintained at 4 kΩ. The threshold voltage is a voltage that the semiconductor resistor 71 can withstand. Referring to FIG. 5A, it can be seen that the larger the width $W_R$ is, the larger the threshold voltage is, even at an identical resistance value.

FIG. 5B shows data obtained by measuring a threshold voltage value while varying the width $W_R$ of the semiconductor resistor 71 when a resistance value of the semiconductor resistor 71 is 1 kΩ, 4 kΩ, and 8 kΩ. Referring to FIG. 5B, a condition under which a threshold voltage is at least 0.5 kV may be confirmed when a resistance value of the semiconductor resistor 71 is 4 kΩ and the width is 60 μm or more and when a resistance value of the semiconductor resistor 71 is 8 kΩ and the width is 30 μm or more. When the resistance value of the semiconductor resistor 71 is 1 kΩ, to increase the threshold voltage value to 0.5 kV or more, the width of the semiconductor resistor 71 is to be increased to 120 μm or more, which may be difficult to achieve due to space limitation.

In exemplary embodiments, the resistance value of the semiconductor resistor 71 may be set to be about 3 kΩ to about 10 kΩ, or about 4 kΩ to about 8 kΩ. In exemplary embodiments, the width of the semiconductor resistor 71 may be set to be between about 30 μm and about 120 μm.

The resistance value, the width, and the length of the semiconductor resistor 71 are set in consideration of the threshold voltage value and the space limitation by the data to confirm that the semiconductor resistor 71 can effectively protect pixels from ESD. Thus, in exemplary embodiments, the semiconductor resistor 71 is disposed so as to correspond to the terminal opening 118OP, which is an in which where the inspection terminal 61 is exposed, thereby effectively protecting pixels from ESD.

Hereinafter, a structure in which structures included in a display device according to an exemplary embodiment are stacked will be described with reference to FIGS. 6 and 7. FIG. 6 is a cross-sectional view taken along line I-I' of FIG. 1 and line II-II' of FIG. 3 according to an exemplary embodiment. FIG. 7 is a cross-sectional view taken along line III-III' of FIG. 3 according to an exemplary embodiment.

The substrate 110 may be formed of various materials such as, for example, a glass material, a metal material, a plastic material, etc. For example, the substrate 110, which may be a flexible substrate, may include a high-molecular resin such as polyethersulphone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

A buffer layer 111 is disposed on the substrate 110. The buffer layer 111 may reduce or block the penetration of foreign materials, moisture, or external air from a lower side of the substrate 110, and may provide a flat surface on the substrate 110. The buffer layer 111 may include an inorganic material such as, for example, an oxide or nitride, an organic material, or an organic-inorganic composite material, and may have a monolayer structure or a multilayer structure including an inorganic material or an organic material. A barrier layer may be further interposed between the substrate 110 and the buffer layer 111. The barrier layer may block penetration of outside air.

The first TFT T1 includes a semiconductor layer A1, a gate electrode G1, a source electrode S1, and a drain electrode D1, and the second TFT T2 includes a semiconductor layer A2, a gate electrode G2, a source electrode S2, and a drain electrode D2. The first TFT T1 may serve as a driving TFT connected to an OLED 300, and may drive the OLED 300. The second TFT T2 may be connected to a data line DL and may serve as a switching TFT. Although two TFTs are shown illustrated, the number of TFTs is not limited thereto. For example, in an exemplary embodiment, the number of TFTs may be variously changed from two to seven.

The semiconductor layers A1 and A2 may include amorphous silicon or polysilicon. In an exemplary embodiment, the semiconductor layers A1 and A2 may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). Each of the semiconductor layers A1 and A2 may include a channel region, and source and drain regions that are doped with impurities. The semiconductor layers A1 and A2 may be a single layer or multiple layers.

The gate electrodes G1 and G2 are disposed on the semiconductor layers A1 and A2, and a first gate insulating layer 112 is interposed between the gate electrodes G1 and G2. Each of the gate electrodes G1 and G2 may include, for example, molybdenum (Mo), Al, copper (Cu), or Ti, and may be formed as a single layer or multiple layers. For example, each of the gate electrodes G1 and G2 may be a monolayer of Mo.

The first gate insulating layer 112 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

A second gate insulating layer 113 may be provided, and may cover the gate electrodes G1 and G2. The second gate insulating layer 113 may include, for example, $SiO_2$, $SiN_x$, SiON, $Al_2O_3$, $TiO_2$, $Ta_2O_5$, $HfO_2$, or $ZrO_2$.

A first electrode CE1 of the storage capacitor Cst may overlap the first TFT T1. For example, the gate electrode G1 of the first TFT T1 may serve as the first electrode CE1 of the storage capacitor Cst.

A second electrode CE2 of the storage capacitor Cst overlaps the first electrode CE1, and the second gate insulating layer 113 is interposed between the second electrode CE2 and the first electrode CE1. The second gate insulating layer 113 may serve as a dielectric layer of the storage capacitor Cst. The second electrode CE2 may include, for example, Mo, Al, Cu, or Ti, and may be formed as a single layer or multiple layers including the above materials. For example, the second electrode CE2 may be a monolayer of Mo or a multilayer of Mo/Al/Mo.

The source electrodes S1 and S2 and the drain electrodes D1 and D2 are disposed on an interlayer insulating layer 115. Each of the source electrodes S1 and S2 and the drain electrodes D1 and D2 may include, for example, Mo, Al, Cu, or Ti, and may be formed as a single layer or multiple layers including the above materials. For example, each of the source electrodes S1 and S2 and the drain electrodes D1 and D2 may have a multilayer structure of Ti/Al/Ti.

A planarization layer 118 may be disposed on the source electrodes S1 and S2 and the drain electrodes D1 and D2, and the OLED 300 may be disposed on the planarization layer 118.

The planarization layer 118 may have a flat top surface so that a pixel electrode 310 of the OLED 300 may be formed flat. The planarization layer 118 may include organic materials and may be formed as a single layer or multiple layers. The planarization layer 118 may include, for example, a general polymer such as benzocyclobutene (BCB), PI, hexamethyldisiloxane (HMDSO), polymethylmethacrylate (PMMA), and polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. The planarization layer 118 may include an inorganic material. The planarization layer 118 may include, for example, $SiO_2$, $SiN_x$, SiON, $Al_2O_3$, $TiO_2$, $Ta_2O_5$, $HfO_2$, or $ZrO_2$. When the planarization layer 118 is formed of an inorganic material, chemical planarization polishing may be performed in some cases. The planarization layer 118 may include both an organic material and an inorganic material.

In the display area DA of the substrate 110, the OLED 300 is disposed over the planarization layer 118. The OLED 300 includes the pixel electrode 310, an intermediate layer 320 including an organic light-emitting layer, and an opposite electrode 330.

The planarization layer 118 has an opening that exposes any one of the source electrode S1 and the drain electrode D1 of the first TFT T1, and the pixel electrode 310 contacts the source electrode S1 or the drain electrode D1 through the opening and is electrically connected to the first TFT T1.

The pixel electrode 310 may be a transparent electrode or a reflective electrode. In exemplary embodiments, the pixel electrode 310 may include a reflective film formed of, for example, silver (Ag), magnesium (Mg), aluminum (Al), platinum (Pt), palladium (Pd), gold (Au), nickel (Ni), neodymium (Nd), iridium (Jr), chromium (Cr), or a compound thereof, and a transparent or semi-transparent electrode layer formed on the reflective film. The transparent or semi-transparent electrode layer may include indium tin oxide (ITO), indium zinc oxide (IZO), zinc oxide (ZnO), indium oxide ($In_2O_3$), indium gallium oxide (IGO), or aluminum zinc oxide (AZO).

A pixel-defining layer 119 may be disposed over the planarization layer 118 and may define a light-emitting area of pixels by having an opening 119OP that exposes an opening corresponding to each of sub-pixels in the display area DA, that is, at least a central portion of the pixel electrode 310. Furthermore, the pixel-defining layer 119 may prevent generation of an arc on edges of the pixel electrode 310 by increasing a distance between the edges of the pixel electrode 310 and the opposite electrode 330 above the pixel electrode 310. The pixel-defining layer 119 may include at least one organic insulating material of, for example, PI, polyamide, acrylic resin, BCB, and phenolic resin, and may be formed by spin coating.

The intermediate layer 320 of the OLED 300 may include an organic emission layer. The organic emission layer may include an organic material including a fluorescent or phosphorescent material that emits red, green, blue, or white light. The organic emission layer may include a low-molecular weight organic material or a high-molecular weight organic material. A functional layer such as, for example, a hole transport layer (HTL), a hole injection layer (HIL), an electron transport layer (ETL), or an electron injection layer (EIL) may selectively be further disposed over and below the organic emission layer. The intermediate layer 320 may be disposed such that it corresponds to each of a plurality of pixel electrodes 310. However, the disclosure is not limited thereto. The intermediate layer 320 may include a layer that is integral with the plurality of pixel electrodes 310 and various modifications may be made.

The opposite electrode 330 may be a transparent electrode or a reflective electrode. In exemplary embodiments, the opposite electrode 330 may be a transparent electrode or semi-transparent electrode, and may include a metal thin-film, which has a small work function, including, for example, Li, Ca, lithium fluoride (LiF)/Ca, LiF/Al, Al, Ag, Mg or a compound thereof. Furthermore, a transparent conductive oxide (TCO) layer including, for example, ITO, IZO, ZnO, or $In_2O_3$ may further be disposed on the metal thin-film. The opposite electrode 330 may be disposed over the display area DA and the peripheral area PA and may be disposed on the intermediate layer 320 and the pixel-defining layer 119. The opposite electrode 330 may be formed integrally with a plurality of OLEDs 300 such that it corresponds to the plurality of pixel electrodes 310.

The semiconductor resistor 71 provided in the same layer as that of the semiconductor layers A1 and A2 may be disposed in the peripheral area PA. The semiconductor resistor 71 may be formed at the same time when the semiconductor layers A1 and A2 are formed. The semiconductor resistor 71 may include, for example, amorphous silicon or polysilicon. The semiconductor resistor 71 may include, for example, an oxide semiconductor material including an oxide of at least one material selected from In, Ga, Sn, Zr, V, Hf, Cd, Ge, Cr, Ti, Al, Cs, Ce, and Zn. The semiconductor resistor 71 may be a single layer or multiple layers.

The inspection terminal 61 may be disposed on a same layer as that of the data line DL. For example, the inspection terminal 61 may be disposed on the interlayer insulating layer 115 in the peripheral area PA. The inspection terminal 61 may be in contact with the semiconductor resistor 71 through the first contact hole CNT1 passing through the interlayer insulating layer 115, the second gate insulating layer 113, and the first gate insulating layer 112.

The first connection wirings 63 of the inspection wiring 80 may be disposed on a same layer as that of the data lines DL. For example, the first connection wiring 63 may be disposed on the interlayer insulating layer 115 in the peripheral area PA. The second connection wiring 81 of the inspection wiring 80 may be disposed on a same layer as that of the gate electrodes G1 and G2. For example, the second connection wiring 81 may be disposed on the first gate insulating layer 112. The second connection wiring 81 may be connected to the data line DL and a scan line of the display area DA. In exemplary embodiments, the second connection wiring 81 may be a portion of the driving wiring 90 (of FIG. 1) for transmitting a data signal, a gate signal, a drive voltage, etc.

One end of the first connection wiring 63 may be in contact with the semiconductor resistor 71 through the second contact hole CNT2 passing through the interlayer insulating layer 115, the second gate insulating layer 113, and the first gate insulating layer 112. The other end of the first connection wiring 63 may be in contact with the second connection wiring 81 through the third contact hole CNT3 passing through the interlayer insulating layer 115, the second gate insulating layer 113, and the first gate insulating layer 112.

The planarization layer 118 is disposed on the substrate 110 over the display area DA and the peripheral area PA outside of the display area DA, and may have the terminal opening 118OP that exposes the inspection terminal 61 in the peripheral area PA.

An inspection signal may be applied by contacting an inspection pin CP for applying the inspection signal to the inspection terminal 61 exposed by the planarization layer 118. The applied inspection signal is applied to the display area DA through the inspection terminal 61, the semiconductor resistor 71, the first connection wiring 63, and the second connection wiring 81 to determine whether there is a defective pixel. When the inspection pin CP contacts the inspection terminal 61 as described above, a discharge due to static electricity may occur due to a sudden application of a large voltage. As a result, the semiconductor resistor 71 may be provided in the inspection terminal 61.

In an exemplary embodiment, at least a portion of the semiconductor resistor 71 may be disposed so as to at least partially correspond to the terminal opening 118OP. Also, the first contact hole CNT1 may be disposed to correspond to the inside of the terminal opening 118OP.

Referring to FIG. 7, when a barrier wall 118W is formed between the plurality of inspection terminals 61 in a first direction by the planarization layer 118 and an inspection signal is applied to an inspection terminal 61 by the inspection pin CP, exemplary embodiments may prevent the other inspection terminals 61 in the periphery from being influenced, or may reduce the influence on the other inspection terminals 61. For example, the terminal opening 118OP defined in the planarization layer 118 is formed to correspond to a central portion of the inspection terminal 61, and the barrier wall 118W capable of blocking an interference signal may be formed in a region between the plurality of inspection terminals 61.

Although FIG. 7 shows only one inspection pin CP, the disclosure is not limited thereto. For example, in an exemplary embodiment, a plurality of inspection pins CP may be provided so as to be in contact with the plurality of inspection terminals 61 at the same time, respectively.

A display device according to an exemplary embodiment may further include a thin-film encapsulation film or a sealing substrate that seals the display area DA. The thin-film encapsulation film or the sealing substrate may cover the OLED 300 disposed in the display area DA and protect the OLED 300 from external moisture or oxygen. The thin-film encapsulation film may have a structure in which a first inorganic encapsulation layer, an organic encapsulation layer, and a second inorganic encapsulation layer are stacked. The sealing substrate may be formed of, for example, a glass material, and may be bonded to the substrate 110 by a sealing member such as a frit in the peripheral area PA of the substrate 110.

Various functional layers such as, for example, a touch screen layer and a polarizing film may be further disposed above the thin-film encapsulation film or the sealing substrate, and a capping layer that may improve light efficiency may be further disposed above the opposite electrode 330.

Figure 8:
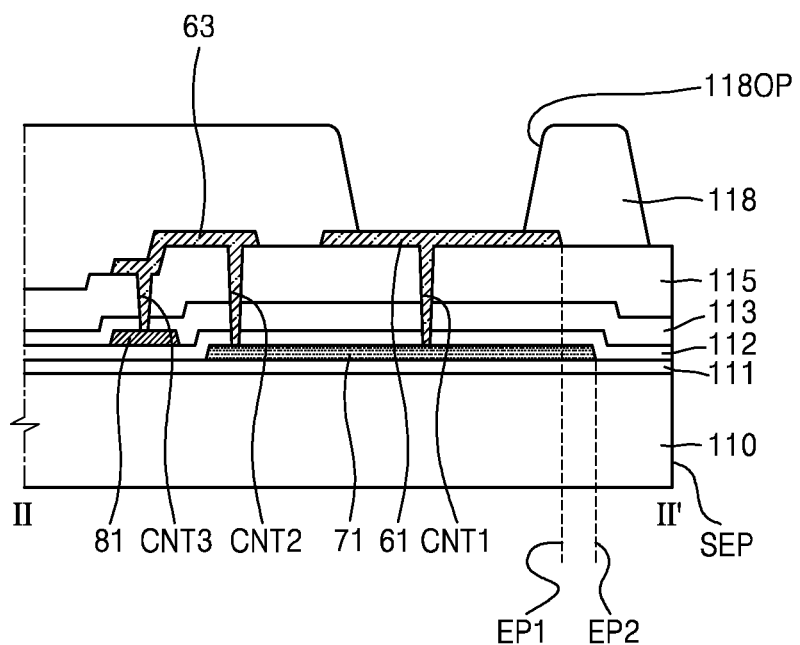
FIG. 8 is a cross-sectional view of a portion of a display device according to an exemplary embodiment.

FIG. 8 is a cross-sectional view of a portion of a display device according to an exemplary embodiment. For example, FIG. 8 is a cross-sectional view schematically showing the vicinity of an inspection terminal. In FIG. 8, the same reference numerals in FIG. 6 denote the same elements. Thus, for convenience of explanation, a duplicate description of elements previously described will be omitted.

Referring to FIG. 8, a display device according to an exemplary embodiment includes the inspection terminal 61 disposed in the peripheral area PA of the substrate 110 that transmits an inspection signal to a pixel, the inspection wiring 80 connected to the inspection terminal 61, the semiconductor resistor 71 connected to the inspection terminal 61 and the inspection wiring 80 through the contact holes CNT1 and CNT2, and the planarization layer 118 including the terminal opening 118OP exposing a central portion of the inspection terminal 61. The semiconductor resistor 71 is disposed so as to at least partially correspond to the terminal opening 118OP. For example, the semiconductor resistor 71 is disposed such that at least a portion of the semiconductor resistor 71 is disposed within a boundary of the terminal opening 118OP below the terminal opening 118OP. That is, a portion of the semiconductor resistor 71 is overlapped by the terminal opening 118OP. In addition, in an exemplary embodiment, an end of the semiconductor resistor 71 is overlapped by the terminal opening 1180P, as shown in FIG. 6.

In an exemplary embodiment, an outer end portion EP2 of the semiconductor resistor 71 may be formed closer to an edge SEP of the substrate 110 than an outer end portion EP1 of the inspection terminal 61. Here, the term "outer" refers to a portion of the substrate 110 that is placed in an edge direction, not a display area direction. In an exemplary embodiment, the end portion EP2 of the semiconductor resistor 71 is not in the terminal opening 118OP. For example, in an exemplary embodiment, the end portion EP2 of the semiconductor resistor 71 is not disposed within the boundary of the terminal opening 118OP.

The semiconductor resistor 71 may protect pixels from ESD. Accordingly, a predetermined resistance value is selected. To secure a predetermined resistance value, the semiconductor resistor 71 may be disposed to overlap the terminal opening 118OP. Accordingly, the semiconductor resistor 71 according to an exemplary embodiment has an area overlapping the inspection terminal 61, and a size of the peripheral area PA may be minimized or reduced. Accordingly, a dead space of the peripheral area PA may be minimized or reduced according to exemplary embodiments.

Figure 9:
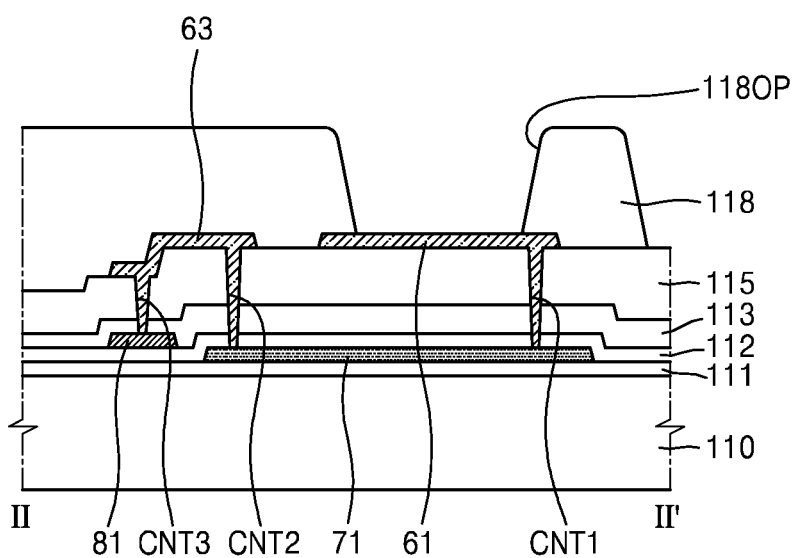
FIG. 9 is a cross-sectional view of a portion of a display device according to an exemplary embodiment.

FIG. 9 is a cross-sectional view of a portion of a display device according to an exemplary embodiment. For example, FIG. 9 is a cross-sectional view schematically showing the vicinity of an inspection terminal. In FIG. 9, the same reference numerals in FIG. 6 denote the same elements. Thus, for convenience of explanation, a duplicate description of elements previously described will be omitted.

Referring to FIG. 9, a display device according to an exemplary embodiment includes the inspection terminal 61 disposed in the peripheral area PA of the substrate 110, which transmits an inspection signal to a pixel, the inspection wiring 80 connected to the inspection terminal 61, the semiconductor resistor 71 connected to the inspection terminal 61 and the inspection wiring 80 through the contact holes CNT1 and CNT2, and the planarization layer 118 including the terminal opening 118OP that exposes the central portion of the inspection terminal 61. The semiconductor resistor 71 is disposed so as to at least partially correspond to the terminal opening 118OP. For example, the semiconductor resistor 71 is disposed such that at least a portion of the semiconductor resistor 71 is disposed within the boundary of the terminal opening 118OP.

The inspection terminal 61 is in contact with the semiconductor resistor 71 through the first contact hole CNT1, and the first connection wiring 63 of the inspection wiring 80 is in contact with the semiconductor resistor 71 through the second contact hole CNT2. A current path in the semiconductor resistor 71 is determined depending on a position of the first contact hole CNT1, and in an exemplary embodiment, the first contact hole CNT1 is connected to an end of the semiconductor resistor 71.

Therefore, as shown in FIG. 9, in an exemplary embodiment, when an outer end of the semiconductor resistor 71 is not disposed in the terminal opening 118OP, the first contact hole CNT1 is not disposed so as to correspond to the inside of the terminal opening 118OP. For example, in an exemplary embodiment, the first contact hole CNT1 is disposed such that it does not overlap the terminal opening 118OP (e.g., the first contact hole CNT1 is not disposed in the terminal opening 118OP).

The semiconductor resistor 71 may protect pixels from ESD. Thus, a predetermined resistance value is secured. To secure a predetermined resistance value, the semiconductor resistor 71 may be disposed to overlap the terminal opening 118OP. Accordingly, the semiconductor resistor 71 according to an exemplary embodiment has an area overlapping the inspection terminal 61, and a size of the peripheral area PA may be minimized or reduced. Thus, a dead space of the peripheral area PA may be minimized or reduced.

Figure 10:
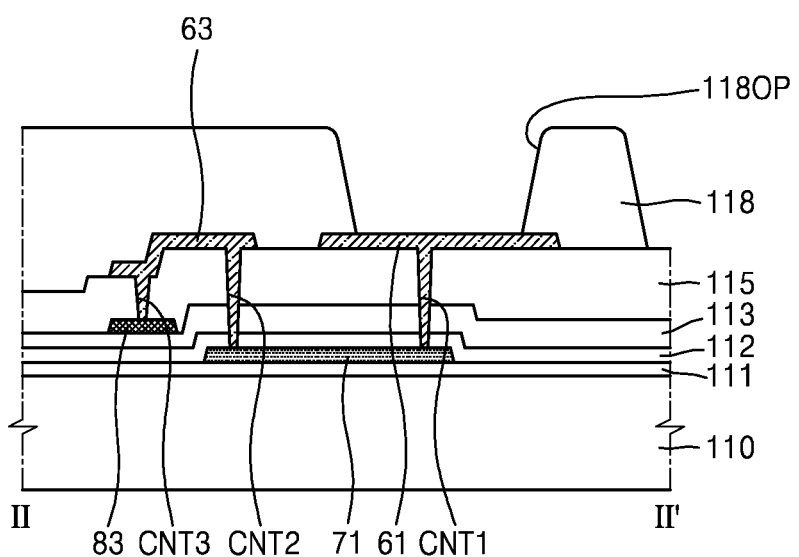
FIG. 10 is a cross-sectional view of a portion of a display device according to an exemplary embodiment.

FIG. 10 is a cross-sectional view of a portion of a display device according to an exemplary embodiment. For example, FIG. 10 is a cross-sectional view schematically showing the vicinity of an inspection terminal. In FIG. 10, the same reference numerals in FIG. 6 denote the same elements. Thus, for convenience of explanation, a duplicate description of elements previously described will be omitted.

Referring to FIG. 10, a display device according to an exemplary embodiment includes the inspection terminal 61 disposed in the peripheral area PA of the substrate 110, which transmits an inspection signal to a pixel, the inspection wiring 80 connected to the inspection terminal 61, the semiconductor resistor 71 connected to the inspection terminal 61 and the inspection wiring 80 through the contact holes CNT1 and CNT2, and the planarization layer 118 including the terminal opening 118OP that exposes the central portion of the inspection terminal 61. The semiconductor resistor 71 is disposed so as to at least partially correspond to the terminal opening 118OP. For example, the semiconductor resistor 71 is disposed such that at least a portion of the semiconductor resistor 71 is disposed within the boundary of the terminal opening 118OP.

The inspection wiring 80 may include the first connection wiring 63 and a second connection wiring 83. The first connection wiring 63 may be disposed on a same layer as that of the inspection terminal 61 and the data line DL (see FIG. 6). For example, the first connection wiring 63 may be disposed on the interlayer insulating layer 115, and may be in contact with the semiconductor resistor 71 through the second contact hole CNT2 passing through the interlayer insulating layer 115, the second gate insulating layer 113, and the first gate insulating layer 112.

In an exemplary embodiment, the second connection wiring 83 may be disposed on a same layer as that of the second electrode CE2 of the storage capacitor Cst in the display area DA. For example, the second connection wiring 83 may be disposed on the second gate insulating layer 113 and may be connected to the first connection wiring 63 through the third contact hole CNT3 passing through the interlayer insulating layer 115. The second connection wiring 83 may be connected to the display area DA and may transmit an inspection signal to the display area DA. In exemplary embodiments, the second connection wiring 83 may be connected to the driving wiring 90 (see FIG. 1).

Figure 11:
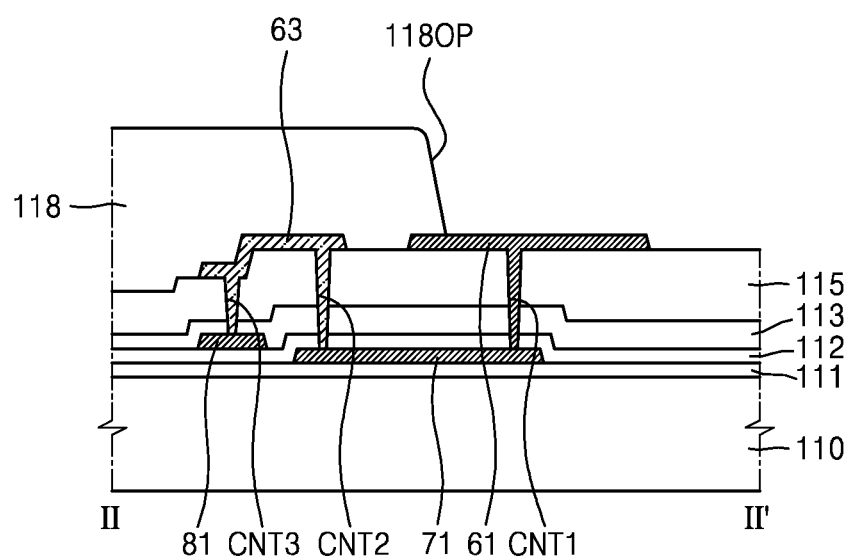
FIG. 11 is a cross-sectional view of a portion of a display device according to an exemplary embodiment.

FIG. 11 is a cross-sectional view of a portion of a display device according to an exemplary embodiment. For example, FIG. 11 is a cross-sectional view schematically showing the vicinity of an inspection terminal. In FIG. 11, the same reference numerals in FIG. 6 denote the same elements. Thus, for convenience of explanation, a duplicate description of elements previously described will be omitted.

Referring to FIG. 11, a display device according to an exemplary embodiment includes the inspection terminal 61 disposed in the peripheral area PA of the substrate 110, which transmits an inspection signal to a pixel, the inspection wiring 80 connected to the inspection terminal 61, the semiconductor resistor 71 connected to the inspection terminal 61 and the inspection wiring 80 through the contact holes CNT1 and CNT2, and the planarization layer 118 including the terminal opening 118OP that exposes the central portion of the inspection terminal 61. The semiconductor resistor 71 is disposed so as to at least partially correspond to the terminal opening 118OP. For example, the semiconductor resistor 71 is disposed such that at least a portion of the semiconductor resistor 71 is disposed within the boundary of the terminal opening 118OP.

In an exemplary embodiment, one end of the inspection terminal 61 is not covered by the planarization layer 118. For example, in an exemplary embodiment, an outer end of the inspection terminal 61 is not covered by the planarization layer 118. This configuration may be obtained by patterning in a shape that opens to one end when the terminal opening 118OP of the planarization layer 118 is formed. Alternatively, a portion of the planarization layer 118 may be removed to expose the outer end of the inspection terminal 61 in a later operation of cutting an edge of the substrate 110. In an exemplary embodiment, the inspection terminal 61 may remain on the substrate 110 even after a controller is mounted on the driving terminal unit 50 (see FIG. 1). However, the present disclosure is not limited thereto. For example, a portion or the entirety of the inspection terminal 61 may be removed in the operation of cutting an edge of the substrate 110.

Figure 12:
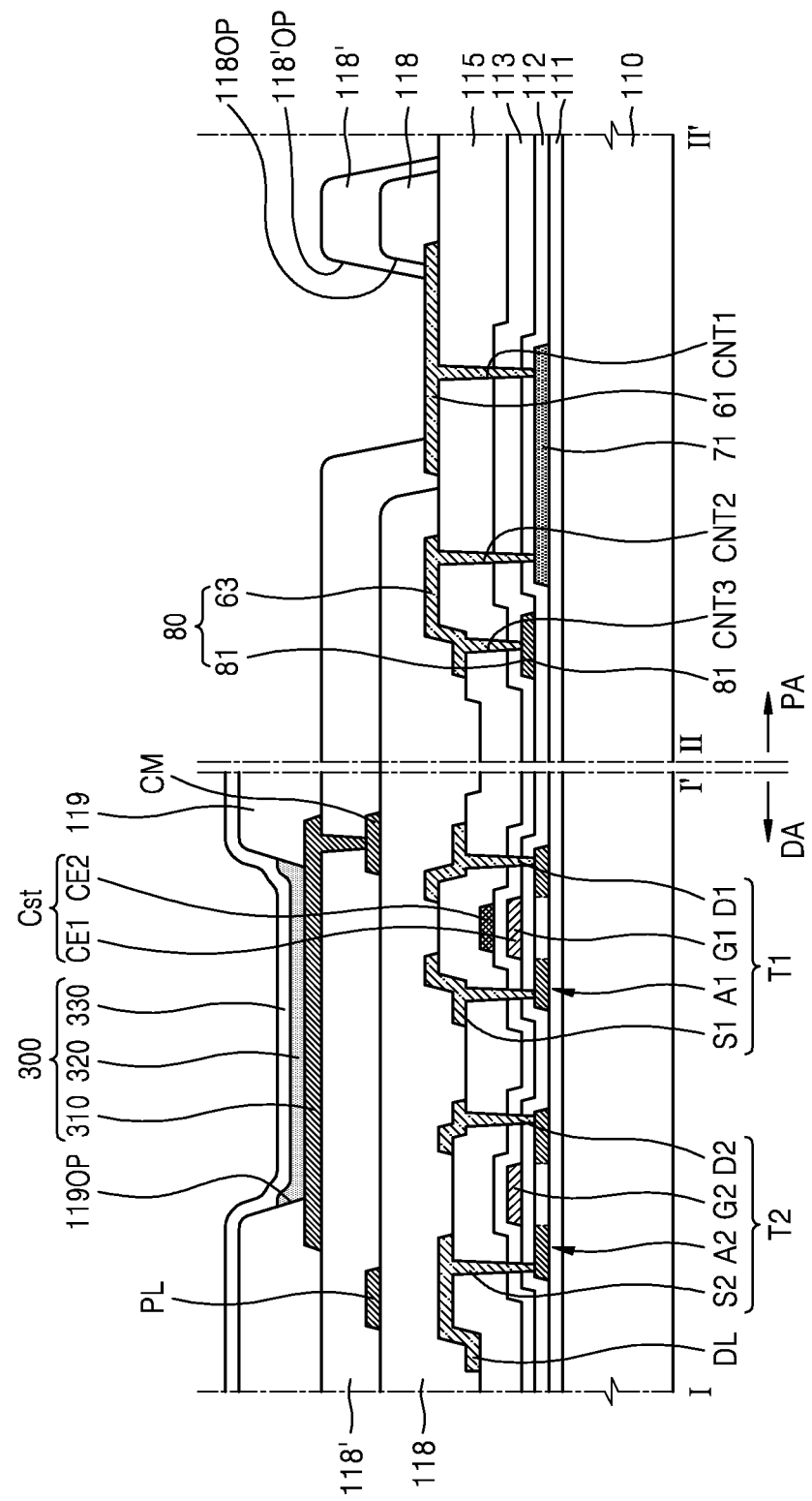
FIG. 12 is a cross-sectional view of a portion of a display device according to an exemplary embodiment.

FIG. 12 is a cross-sectional view of a portion of a display device according to an exemplary embodiment. In FIG. 12, the same reference numerals in FIG. 6 denote the same elements. Thus, for convenience of explanation, a duplicate description of elements previously described will be omitted.

Referring to FIG. 12, a display device according to an exemplary embodiment includes the inspection terminal 61 disposed in the peripheral area PA of the substrate 110, which transmits an inspection signal to a pixel, the inspection wiring 80 connected to the inspection terminal 61, the semiconductor resistor 71 connected to the inspection terminal 61 and the inspection wiring 80 through the contact holes CNT1 and CNT2, and the planarization layer 118 including the terminal opening 118OP that exposes a central portion of the inspection terminal 61. The semiconductor resistor 71 is disposed so as to at least partially correspond to the terminal opening 118OP. For example, the semiconductor resistor 71 is disposed such that at least a portion of the semiconductor resistor 71 is disposed within the boundary of the terminal opening 118OP.

Furthermore, the display device according to an exemplary embodiment may further include an upper planarization layer 118' disposed on the planarization layer 118. The upper planarization layer 118' may further include an additional wiring PL and an intermediate wiring CM.

The upper planarization layer 118' may include an organic material and/or an inorganic material. For example, the organic material may include a general polymer such as BCB, PI, HMDSO, PMMA, and PS, a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. The inorganic material may include, for example, $SiO_2$, $SiN_x$, SiON, $Al_2O_3$, $TiO_2$, $Ta_2O_5$, $HfO_2$, or $ZrO_2$. The upper planarization layer 118' may be a single layer or multiple layers.

The additional wiring PL disposed on the planarization layer 118 may serve as a driving voltage line that transmits a driving voltage or a data line that transmits a data signal. The additional wiring PL may be connected to the data line DL through a contact hole defined in the planarization layer 118. Furthermore, the pixel electrode 310 of the OLED 300 and the driving TFT T1 may be connected to each other through the intermediate wiring CM on the planarization layer 118. The additional wiring PL and the intermediate wiring CM include, for example, Mo, Al, Cu, Ti, etc., and may be formed as a single layer or multiple layers.

The upper planarization layer 118' disposed in the peripheral area PA may include an additional terminal opening 118'OP that exposes the central portion of the inspection terminal 61. Although FIG. 12 shows that an area of the additional terminal opening 118'OP is smaller than an area of the terminal opening 118OP, the disclosure is not limited thereto. In an exemplary embodiment, the area of the additional terminal opening 118'OP is larger than the area of the terminal opening 118OP, or is opened in an edge of the substrate 110, and various modifications may be made.

The semiconductor resistor 71 may protect pixels from ESD. Thus, a predetermined resistance value is secured. To secure a predetermined resistance value, the semiconductor resistor 71 may be disposed to overlap the terminal opening 118OP. For example, the semiconductor resistor 71 may be disposed within the boundary of the terminal opening 118OP. Accordingly, the semiconductor resistor 71 according to the exemplary embodiment of FIG. 12 has an area overlapping the inspection terminal 61, and a size of the peripheral area PA may be minimized or reduced. As a result, a dead space of the peripheral area PA may be minimized or reduced.

Figure 13:
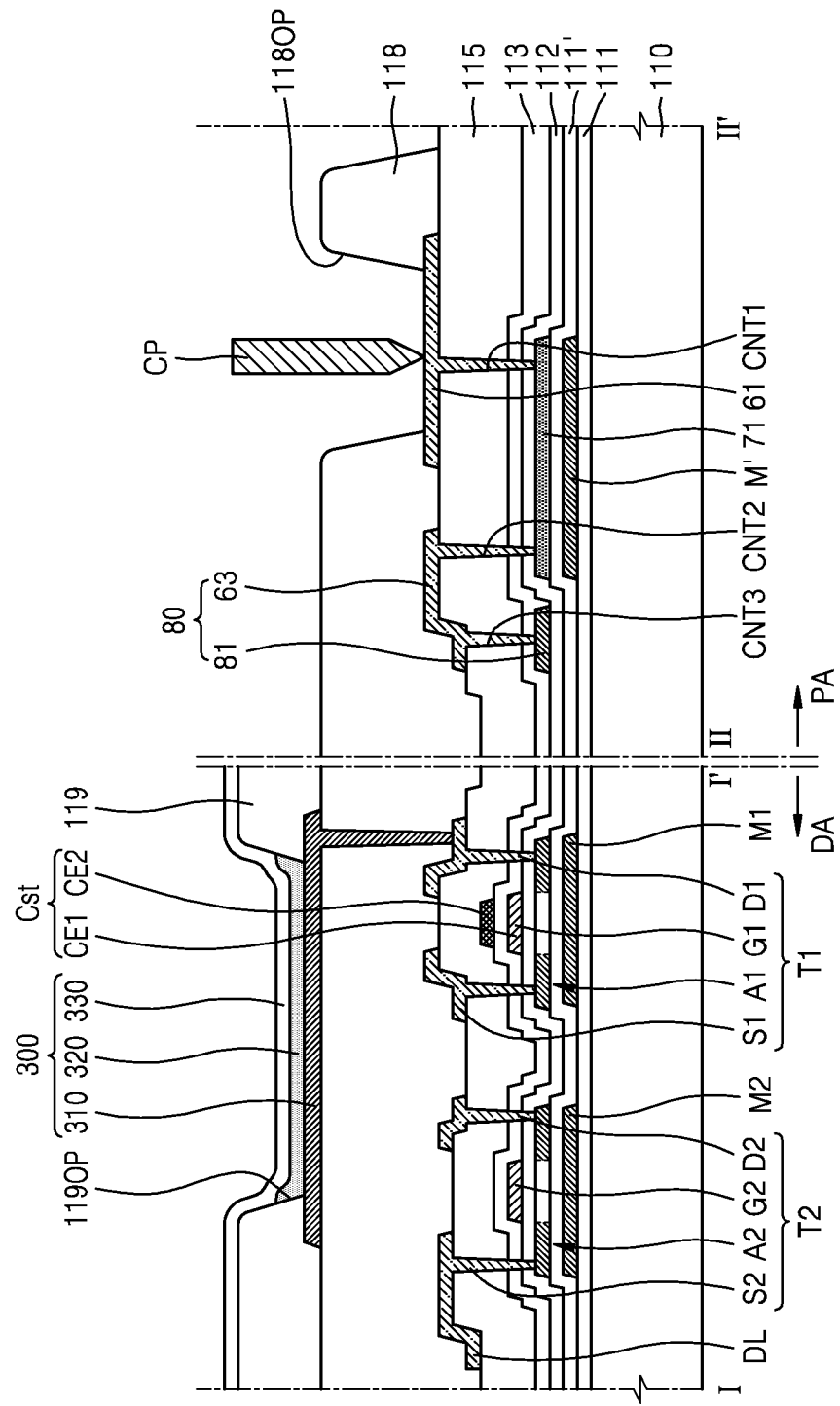
FIG. 13 is a cross-sectional view of a portion of a display device according to an exemplary embodiment.

FIG. 13 is a cross-sectional view of a portion of a display device according to an exemplary embodiment. In FIG. 13, the same reference numerals in FIG. 6 denote the same elements. Thus, for convenience of explanation, a duplicate description of elements previously described will be omitted.

Referring to FIG. 13, a display device according to an exemplary embodiment includes the inspection terminal 61 disposed in the peripheral area PA of the substrate 110, which transmits an inspection signal to a pixel, the inspection wiring 80 connected to the inspection terminal 61, the semiconductor resistor 71 connected to the inspection terminal 61 and the inspection wiring 80 through the contact holes CNT1 and CNT2, and the planarization layer 118 including the terminal opening 118OP that exposes the central portion of the inspection terminal 61. The semiconductor resistor 71 is disposed so as to at least partially correspond to the terminal opening 118OP. For example, the semiconductor resistor 71 is disposed such that at least a portion of the semiconductor resistor 71 is disposed within the boundary of the terminal opening 118OP.

Furthermore, the display device according to an exemplary embodiment may further include lower metal layers M1 and M2 disposed below the semiconductor layers A1 and A2 so as to correspond to the semiconductor layers A1 and A2. For example, the lower metal layer M1 may be disposed in an area corresponding to the semiconductor layer A1, and the lower metal layer M2 may be disposed in an area corresponding to the semiconductor layer A2. The lower metal layers M1 and M2 may be disposed between the substrate 110 and the semiconductor layers A1 and A2, and may shield light that may be incident on the semiconductor layers A1 and A2. The lower metal layers M1 and M2 include, for example, Mo, Al, Cu, or Ti and may be a single layer or multiple layers.

The lower metal layers M1 and M2 may be disposed on the buffer layer 111. An insulating layer 111' is disposed between the lower metal layers M1 and M2 and the semiconductor layers A1 and A2. The insulating layer 111' may include, for example, $SiO_2$, $SiN_x$, SiON, $Al_2O_3$, $TiO_2$, $Ta_2O_5$, $HfO_2$, or $ZrO_2$.

Characteristics of the semiconductor layers A1 and A2 may be changed by light. The change in characteristics of the semiconductor layers A1 and A2 may lead to a change in characteristics of the TFTs T1 and T2. In the exemplary embodiment of FIG. 13, the characteristics of the TFTs T1 and T2 may be stabilized without being changed by an external light by introducing the lower metal layers M1 and M2.

In exemplary embodiments, a voltage may be applied to the lower metal layers M1 and M2. For example, a driving voltage may be applied to the lower metal layers M1 and M2 and may be connected to the source electrodes S1 and S2, the drain electrodes D1 and D2, or the gate electrodes G1 and G2 of the TFTs T1 and T2, so that a voltage interlocking with them may be applied. Thus, the characteristics of the TFTs T1 and T2 may be stabilized.

In the exemplary embodiment of FIG. 13, a peripheral lower metal layer M' may be disposed so as to correspond to a lower portion of the semiconductor resistor 71 in the peripheral area PA. For example, the peripheral lower metal layer M' may be disposed in an area corresponding to the semiconductor resistor 71. The peripheral lower metal layer M' may be provided in the same layer as that of the lower metal layers M1 and M2 and may be formed of the same material as that of the lower metal layers M1 and M2. The peripheral lower metal layer M' may include, for example, Mo, Al, Cu, or Ti, and may be a single layer or multiple layers. In exemplary embodiments, a voltage may be applied to the peripheral lower metal layer M'. For example, the lower metal layers M1 and M2 may be connected to a driving voltage line, a data line, or a scan line so that a voltage interlocking with them may be applied.

The semiconductor resistor 71 may protect pixels from ESD. Thus, a predetermined resistance value is secured. To secure a predetermined resistance value, the semiconductor resistor 71 may be disposed to overlap the terminal opening 118OP. For example, the semiconductor resistor 71 may be disposed such that at least a portion of the semiconductor resistor 71 is within the boundary of the terminal opening 118OP. Accordingly, the semiconductor resistor 71 according to the exemplary embodiment of FIG. 13 has an area overlapping the inspection terminal 61, and a size of the peripheral area PA may be minimized or reduced. As a result, a dead space of the peripheral area PA may be minimized or reduced.

The exemplary embodiments described herein may be embodied as separate exemplary embodiments or combined exemplary embodiments. For example, exemplary embodiments illustrated in FIGS. 12 and/or 13 may be applied to the exemplary embodiments described with reference to FIGS. 6 to 11, and various combinations may be made.

As described above, a display device according to exemplary embodiments may secure an area in which a semiconductor resistor connected to an inspection terminal overlaps the inspection terminal. As a result, a space in a peripheral area of the display device may be reduced. In addition, since the semiconductor resistor has at least a predetermined width, defects due to a high current density may be minimized or reduced. However, the scope of the present disclosure is not limited to these effects.

It should be understood that descriptions of features or aspects within each exemplary embodiment should typically be considered as available for other similar features or aspects in other exemplary embodiments, unless the context clearly indicates otherwise.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display device, comprising:
   a substrate comprising a display area and a peripheral area, wherein the display area comprises a plurality of pixels that display an image and the peripheral area is disposed outside the display area;
   an inspection terminal disposed in the peripheral area and configured to transmit an inspection signal to the display area;
   an inspection wiring that connects the display area to the inspection terminal;
   a semiconductor resistor connected to each of the inspection terminal and the inspection wiring;
   an insulating film; and
   a planarization layer comprising a terminal opening, wherein the planarization layer covers at least one end of the inspection terminal and the terminal opening exposes a portion of the inspection terminal,
   wherein the semiconductor resistor is disposed below the inspection terminal, the insulating film is disposed between the semiconductor resistor and the inspection terminal, and the semiconductor resistor is in contact with the inspection terminal through a first contact hole defined in the insulating film,
wherein a portion of the semiconductor resistor is overlapped by the terminal opening,
wherein the inspection terminal is disposed on a same layer as the inspection wiring,
wherein the inspection wiring comprises a first connection wiring and a second connection wiring,
wherein the first connection wiring and the inspection terminal are disposed on a same layer, and
wherein the second connection wiring is disposed on a different layer than the first connection wiring.

2. The display device of claim 1, wherein a width of the semiconductor resistor is about equal to or greater than a width of the inspection wiring.

3. The display device of claim 1, wherein the first contact hole is disposed inside the terminal opening.

4. The display device of claim 1, wherein one end of the semiconductor resistor is overlapped by the terminal opening.

5. The display device of claim 1, further comprising:
a barrier wall formed by the planarization layer; and
an additional inspection terminal,
wherein the barrier wall is disposed between the inspection terminal and the additional inspection terminal.

6. The display device of claim 1, wherein the semiconductor resistor comprises at least one of polysilicon and an oxide semiconductor.

7. The display device of claim 1,
wherein the first connection wiring is in contact with the semiconductor resistor through a second contact hole defined in the insulating film.

8. The display device of claim 7, further comprising:
a thin-film transistor disposed in the display area and comprising a semiconductor layer, a gate electrode, a source electrode, and a drain electrode,
wherein the semiconductor resistor and the semiconductor layer are disposed on a same layer, and the second connection wiring and the gate electrode are disposed on a same layer.

9. The display device of claim 7, further comprising:
a thin-film transistor disposed in the display area and comprising a semiconductor layer, a gate electrode, a source electrode, and a drain electrode; and
a storage capacitor that overlaps the thin-film transistor and comprises a first electrode and a second electrode,
wherein the second connection wiring and the second electrode are disposed on a same layer.

10. The display device of claim 1, wherein another end of the inspection terminal other than the at least one end is not covered by the planarization layer.

11. The display device of claim 1, further comprising:
an upper planarization layer disposed on the planarization layer; and
an additional wiring disposed on the upper planarization layer.

12. The display device of claim 11, wherein the upper planarization layer comprises an additional terminal opening corresponding to the terminal opening in the peripheral area.

13. The display device of claim 1, further comprising:
an organic light-emitting device disposed in the display area and comprising a pixel electrode, an intermediate layer comprising an organic light-emitting layer, and an opposite electrode.

14. A display device, comprising:
a substrate comprising a display area and a peripheral area disposed outside the display area;
a pixel comprising a thin-film transistor and a display element, wherein the thin-film transistor is disposed in the display area and comprises a semiconductor layer, a gate electrode, a source electrode, and a drain electrode, and the display element is connected to the thin-film transistor;
a driving terminal unit disposed in the peripheral area and comprising a controller configured to control transmission of a driving signal to the pixel;
an inspection terminal disposed in the peripheral area and configured to transmit an inspection signal to the pixel;
an inspection wiring that connects the inspection terminal to the pixel;
an insulating film;
a semiconductor resistor disposed below the inspection terminal, wherein the insulating film is disposed between the semiconductor resistor and the inspection terminal, and the semiconductor resistor is in contact with the inspection terminal through a first contact hole defined in the insulating film; and
a planarization layer comprising a terminal opening, wherein the planarization layer covers at least one end of the inspection terminal and the terminal opening exposes a portion of the inspection terminal,
wherein a portion of the semiconductor resistor is overlapped by the terminal opening, and
wherein the inspection terminal is disposed on a same layer as the inspection wiring,
wherein the inspection wiring comprises a first connection wiring and a second connection wiring,
wherein the first connection wiring and the inspection terminal are disposed on a same first layer, and
wherein the second connection wiring is disposed on a second layer that is different layer than the first layer.

15. The display device of claim 14, wherein the first contact hole is disposed inside the terminal opening.

16. The display device of claim 14, further comprising:
a barrier wall formed by the planarization layer; and
an additional inspection terminal,
wherein the barrier wall is disposed between the inspection terminal and the additional inspection terminal.

17. The display device of claim 14,
wherein the gate electrode is disposed on the same second layer that is different than the same first layer.

18. The display device of claim 14, further comprising:
a driving wiring that connects the driving terminal unit to the pixel,
wherein the second connection wiring is connected to the driving wiring.

19. The display device of claim 14, wherein a width of the first connection wiring is about equal to or less than a width of the semiconductor resistor.

20. The display device of claim 14, wherein the display device is an organic light-emitting diode (OLED) device comprising a pixel electrode, an intermediate layer comprising an organic light-emitting layer, and an opposite electrode.

21. The display device of claim 14, further comprising:
a lower metal layer disposed between the substrate and the semiconductor layer in an area corresponding to the semiconductor layer; and
a peripheral lower metal layer disposed on a same layer as the lower metal layer in an area corresponding to the semiconductor resistor.

22. A display device, comprising:
a substrate comprising a display area and a peripheral area, wherein the display area comprises a plurality of pixels that display an image and the peripheral area is disposed outside the display area;
an inspection terminal disposed in the peripheral area and configured to transmit an inspection signal to the display area;
an inspection wiring that connects the display area to the inspection terminal;
a semiconductor resistor connected to each of the inspection terminal and the inspection wiring; and
a planarization layer comprising a terminal opening,
wherein the semiconductor resistor is disposed below the inspection terminal and contacts the inspection terminal through a contact hole,
wherein the contact hole and a portion of the semiconductor resistor are disposed within a boundary of the terminal opening between a first portion of the planarization layer and a second portion of the planarization layer that opposes the first portion,
wherein the inspection wiring comprises a first connection wiring and a second connection wiring,
wherein the first connection wiring and the inspection terminal are disposed on a same layer, and
wherein the second connection wiring is disposed on a different layer than the first connection wiring.

* * * * *